(12) United States Patent
Ahn et al.

(10) Patent No.: US 10,879,105 B2
(45) Date of Patent: Dec. 29, 2020

(54) MICRO LED TRANSFER HEAD AND SYSTEM USING SAME FOR TRANSFERRING MICRO LED

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 0 days.

(21) Appl. No.: 16/421,889

(22) Filed: May 24, 2019

(65) Prior Publication Data

US 2019/0371647 A1 Dec. 5, 2019

(30) Foreign Application Priority Data

May 29, 2018 (KR) .................. 10-2018-0061365
May 29, 2018 (KR) .................. 10-2018-0061370
May 29, 2018 (KR) .................. 10-2018-0061372

(51) Int. Cl.
*H01L 21/683* (2006.01)
*H01L 33/00* (2010.01)
*B25J 15/06* (2006.01)

(52) U.S. Cl.
CPC ...... *H01L 21/6838* (2013.01); *B25J 15/0691* (2013.01); *H01L 33/0095* (2013.01)

(58) Field of Classification Search
CPC ... H01L 21/6838; B25J 15/0691; B65G 47/91

USPC .................................... 294/188, 189
See application file for complete search history.

(56) References Cited

U.S. PATENT DOCUMENTS

| 3,377,096 | A | * | 4/1968 | Wood | B66C 1/0293 294/189 |
| 3,640,562 | A | * | 2/1972 | Creskoff | B66C 1/0281 294/65 |
| 5,772,170 | A | * | 6/1998 | Tsukushi | B25B 11/005 248/363 |
| 6,410,942 | B1 | * | 6/2002 | Thibeault | H01L 33/08 257/88 |
| 7,726,715 | B2 | * | 6/2010 | Nagasawa | B25B 11/005 294/189 |

(Continued)

FOREIGN PATENT DOCUMENTS

| KR | 100731673 B1 | 6/2007 |
| KR | 20140112486 A | 9/2014 |

(Continued)

*Primary Examiner* — Dean J Kramer

(57) ABSTRACT

The present invention relates to a micro LED transfer head and a system using the same for transferring a micro LED, the micro LED transfer head and the system being capable of increasing the efficiency of transferring micro LEDs with vacuum-suction by the micro LED transfer head, removing a factor that interferes with a grip force of the micro LED transfer head gripping the micro LEDs to improve the transfer efficiency of the micro LED transfer head, and preventing foreign substances from entering into a space where the micro LED transfer head is cleaned while cleaning a grip surface of the micro LED transfer head to improve the efficiency of cleaning the grip surface of the micro LED transfer head.

3 Claims, 15 Drawing Sheets

(56) References Cited

U.S. PATENT DOCUMENTS

| | | | | |
|---|---|---|---|---|
| 8,960,749 B2* | 2/2015 | Fukano | ............... | B65G 47/91 |
| | | | | 294/188 |
| 2003/0164620 A1* | 9/2003 | Schmalz | ............... | B66C 1/025 |
| | | | | 294/188 |
| 2018/0096878 A1* | 4/2018 | Wu | ............... | H01L 21/6838 |

FOREIGN PATENT DOCUMENTS

| KR | 20170019415 A | 2/2017 |
|---|---|---|
| KR | 20170024906 A | 3/2017 |
| KR | 20170026959 A | 3/2017 |
| KR | 101754528 B1 | 7/2017 |
| KR | 101757404 B1 | 7/2017 |

* cited by examiner

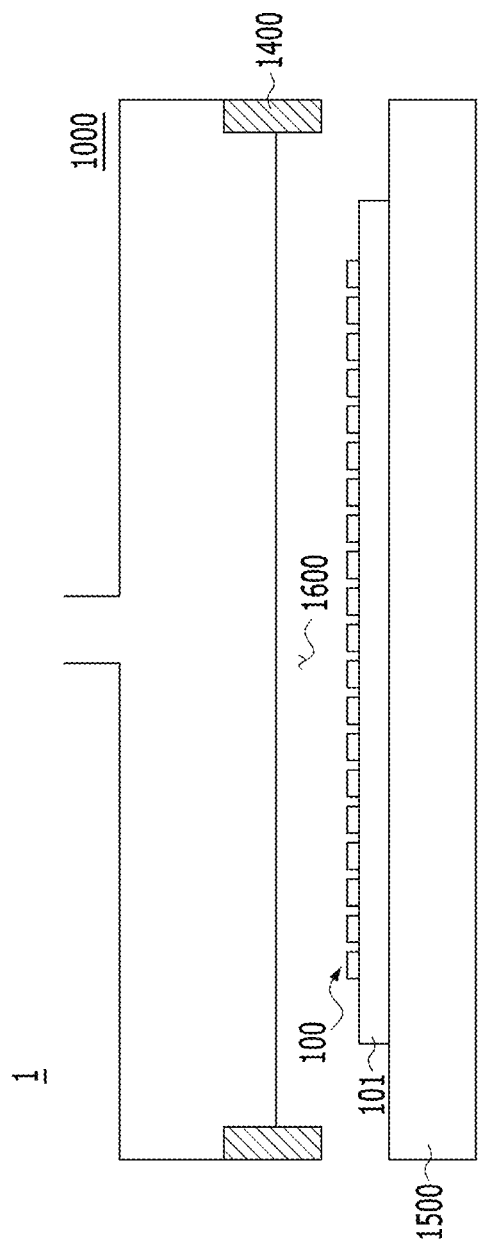
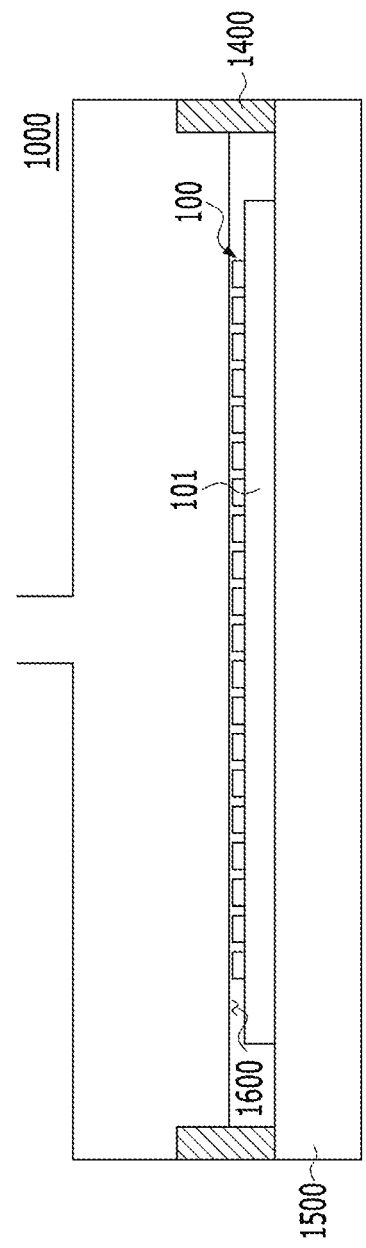
Fig. 11A
Fig. 11B

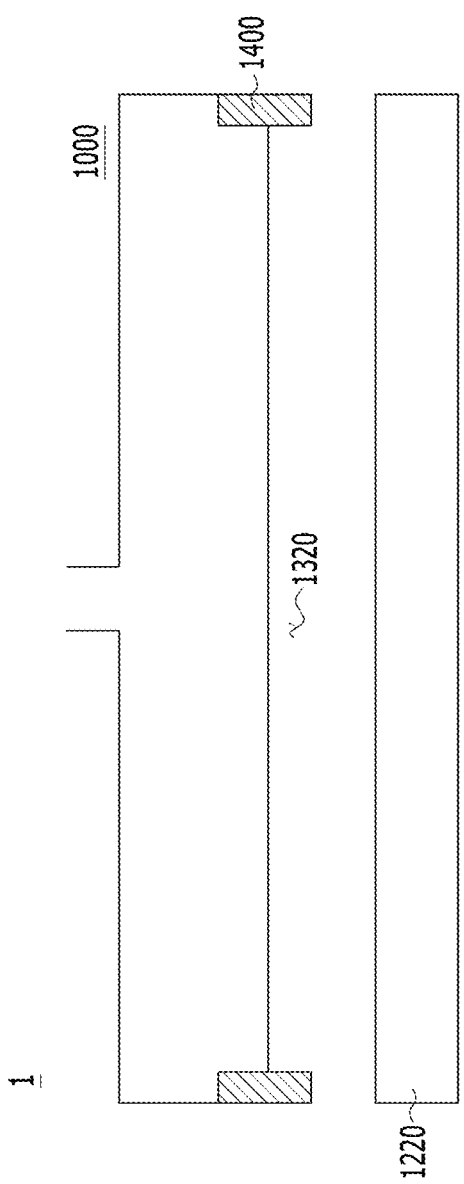
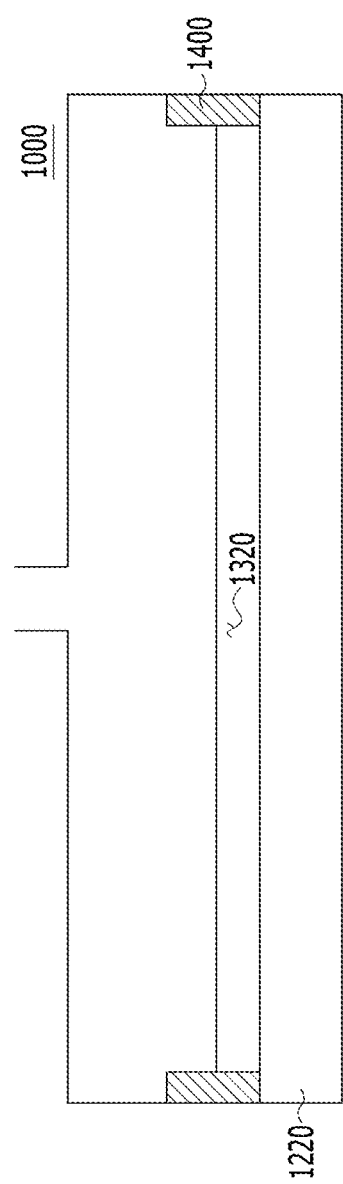

MICRO LED TRANSFER HEAD AND SYSTEM USING SAME FOR TRANSFERRING MICRO LED

CROSS REFERENCE TO RELATED APPLICATION

The present application claims priority to Korean Patent Applications Nos. 10-2018-0061365, 10-2018-0061370, and 10-2018-0061372, filed May 29, 2018, the entire contents of which is incorporated herein for all purposes by this reference.

BACKGROUND OF THE INVENTION

Field of the Invention

The present invention relates to a micro LED transfer head and a system using the same for transferring a micro LED.

Description of the Related Art

Currently, the display market is still dominated by LCDs, but OLEDs are quickly replacing LCDs and emerging as mainstream products. In a current situation where display makers are rushing to participate in the OLED market, micro light-emitting diode (hereinafter, referred to as micro LED) displays have emerged as another next-generation display. Liquid crystal and organic materials are the core materials of LCDs and OLEDs, respectively, whereas the micro LED display uses 1 µm to 100 µm of an LED chip itself as light emitting material.

Since the term "micro LED" emerged in a patent "MICRO-LED ARRAYS WITH ENHANCED LIGHT EXTRACTION" in 1999 (Korean Patent No. 10-0731673, hereinafter referred to as 'Related Art 1') disclosed by Cree Inc., related research papers based thereon were subsequently published. In order to apply the micro LED to a display, it is necessary to develop a customized microchip based on a flexible material and/or flexible device using a micro LED device, and techniques of transferring the micrometer-sized LED chip and mounting the LED chip on a display pixel electrode are required.

Particularly, with regard to the transfer of the micro LED device to a display substrate, as the LED size is reduced to 1 µm to 100 µm, it is impossible to use a conventional pick-and-place machine, and a technology of a transfer head for higher precision is required. With respect to such a technology of a transfer head, several structures have been proposed as described below, but each of the proposed techniques has some problems.

Luxvue Technology Corp., USA, proposed a method of transferring a micro LED using an electrostatic head (Korean Patent Application Publication No. 10-2014-0112486, hereinafter referred to as 'Related Art 2'). X-Celeprint Limited, USA, proposed a method of using an elastic polymer material as a transfer head and transferring a micro LED positioned to a wafer to a desired substrate (Korean Patent Application Publication No. 10-2017-0019415, hereinafter referred to as 'Related Art 3'). Korea Photonics Technology Institute proposed a method of transferring a micro LED using a ciliary adhesive-structured head (Korean Patent No. 10-1754528, hereinafter referred to as 'Related Art 4'). Korea Institute of Machinery and Materials has proposed a method of transferring a micro LED using a roller coated with an adhesive (Korean Patent No. 10-1757404, hereinafter referred to as 'Related Art 5'). Samsung Display Co., Ltd proposed a method of transferring a micro LED to an array substrate according to electrostatic induction by applying a negative voltage to first and second electrodes of the array substrate in a state where the array substrate is immersed in a solution (Korean Patent Application Publication No. 10-2017-0026959, hereinafter referred to as 'Related Art 6'). LG Electronics Inc. proposed a method in which a head holder is disposed between multiple pick-up heads and a substrate and a shape of the head holder is deformed by movement of the multiple pick-up heads such that the multiple pick-up heads are allowed to move freely (Korean Patent Application Publication No. 10-2017-0024906, hereinafter referred to as 'Related Art 7').

The above-mentioned first to seventh inventions focus only on how to transfer micro LEDs. However, it has not been proposed how to eliminate obstructive factors that interfere with the gripping and detaching the micro LEDs when the transfer head transfers the micro LEDs from a first substrate to a second substrate.

Documents of Related Art (Patent Document 1) Korean Patent No. 10-0731673;
(Patent Document 2) Korean Patent Application Publication No. 10-2014-0112486;
(Patent Document 3) Korean Patent Application Publication No. 10-2017-0019415;
(Patent Document 4) Korean Patent No. 10-1754528;
(Patent Document 5) Korean Patent No. 10-1757404;
(Patent Document 6) Korean Patent Application Publication No. 10-2017-0026959; and
(Patent Document 7) Korean Patent Application Publication No. 10-2017-0024906.

SUMMARY OF THE INVENTION

Accordingly, the present invention has been made keeping in mind the above problems occurring in the related art, and an objective of the present invention is to provide a micro LED transfer head and a system using the same for transferring a micro LED, the micro LED transfer head and the system being configured to improve efficiency of the micro LED transfer head vacuum-sucking and transferring micro LEDs.

In addition, another objective of the present invention is to provide a micro LED transfer head and a system using the same for transferring a micro LED, the micro LED transfer head and the system removing a factor that interferes with a grip force of the micro LED transfer head gripping the micro LEDs, thus improving the transfer efficiency of the micro LED transfer head.

Furthermore, still another objective of the present invention is to provide a micro LED transfer head and a system using the same for transferring a micro LED, the micro LED transfer head and the system being configured to prevent foreign substances from entering into a space where a grip surface of the micro LED transfer head is cleaned during a process of cleaning the grip surface, thus improving the efficiency of cleaning the grip surface of the micro LED transfer head.

In order to achieve the objective of the present invention, there is provided a micro LED transfer head including: a porous member having pores and serving as a grip surface;

and a support configured on a periphery of the micro LED transfer head in a manner protruding downward beyond the grip surface.

In addition, the support may be made of an elastic material.

In addition, the support may be embodied by a porous member.

In order to achieve another objective of the present invention, there is provided a system for transferring a micro LED, the system including: a micro LED transfer head including a porous member having pores and serving as a grip surface, the micro LED transfer head including a support configured on a periphery of the micro LED transfer head in a manner protruding downward beyond the grip surface; a first substrate on which a micro LED is formed; and a support member provided underneath the first substrate to support the first substrate, wherein the support is brought into contact with an upper surface of the support member when transferring the micro LED of the first substrate to the grip surface.

In addition, a passage is provided in the micro LED transfer head, the support, or the support member to introduce outside air into a transfer space.

In order to achieve still another objective of the present invention, there is provided a system for transferring a micro LED, the system including: a micro LED transfer head including a porous member serving as a grip surface having pores; a support member supporting a first substrate on which a micro LED is formed; and a support configured on a periphery of the support member in a manner that protrudes upward from the support member.

In order to achieve still another objective of the present invention, there is provided a micro LED transfer head gripping a micro LED onto a grip surface, the micro LED transfer head including: a shielding portion configured on a periphery of the micro LED transfer head in a manner that protrudes downward beyond the grip surface.

In addition, the shielding portion may block an external factor that interferes with a grip force from entering into a transfer space when the micro LED transfer head grips the micro LED.

In addition, the micro LED transfer head may use an electrostatic force, and the shielding portion may prevent a factor that interferes with the electrostatic force of the micro LED transfer head from entering into the transfer space when the micro LED transfer head grips the micro LED using the electrostatic force.

In addition, the micro LED transfer head may use a suction force, and the shielding portion may prevent a factor that interferes with the suction force of the micro LED transfer head from entering into the transfer space when the micro LED transfer head grips the micro LED using the suction force.

In addition, the micro LED transfer head may use a magnetic force, and the shielding portion may prevent a factor that interferes with the magnetic force of the micro LED transfer head from entering into the transfer space when the micro LED transfer head grips the micro LED using the magnetic force.

In addition, the micro LED transfer head may use a van der Waals force, and the shielding portion may prevent a factor that interferes with the van der Waals force of the micro LED transfer head from entering into the transfer space when the micro LED transfer head grips the micro LED using the van der Waals force.

In order to achieve still another objective of the present invention, there is provided a system for transferring a micro LED, the system including: a micro LED transfer head gripping a micro LED onto a grip surface and including a shielding portion configured on a periphery of the micro LED transfer head in a manner that protrudes downward beyond the grip surface; a first substrate on which the micro LED is formed; and a support member provided underneath the first substrate to support the first substrate, wherein the shielding portion contacts with an upper surface of the support member or with an upper surface of the first substrate when transferring the micro LED of the first substrate to the grip surface.

In order to achieve still another objective of the present invention, there is provided a system for transferring a micro LED, the system including: a micro LED transfer head gripping a micro LED onto a grip surface; a first substrate on which the micro LED is formed; and a support member supporting the first substrate, wherein the support member includes a shielding portion configured on a periphery of the support member in a manner that protrudes upward from the support member or configured on a periphery of the first substrate in a manner that protrudes upward from the first substrate.

In order to achieve still another objective of the present invention, there is provided a system for transferring a micro LED, the system including: a micro LED transfer head gripping a micro LED onto a grip surface and including a sealing portion configured on a periphery of the micro LED transfer head in a manner that protrudes downward beyond the grip surface; and a cleaning device cleaning the grip surface, wherein the sealing portion contacts with an upper surface of the cleaning device when the grip surface is cleaned.

In addition, the sealing portion may block foreign substances from entering into a cleaning space when the cleaning device cleans the micro LED transfer head.

In addition, the cleaning device may be a device for blowing an ion wind.

In order to achieve still another objective of the present invention, there is provided a system for transferring a micro LED, the system including: a micro LED transfer head gripping a micro LED onto a grip surface; a cleaning device cleaning the grip surface; and a sealing portion configured on a periphery of the cleaning device in a manner that protrudes upward from the cleaning device.

As described above, in a micro LED transfer head and a system using the same for transferring a micro LED according to the present invention, the transfer efficiency of the micro LED transfer head vacuum-sucking micro LEDs is increased, and an inflow of outside air into a transfer space is adjusted to control vacuum pressure in the transfer space, so that the system can operate effectively.

In addition, in the micro LED transfer head and the system using the same for transferring a micro LED according to the present invention, the transfer space is sealed where the micro LEDs are transferred, and an external factor that interferes with a grip force of the micro LED transfer head is prevented from entering into the transfer space. Accordingly, the grip force is prevented from being reduced by the external factor that may be adhered to the grip surface of the micro LED transfer head, thereby improving the transfer efficiency.

In addition, the system for transferring a micro LED according to the present invention includes a sealing portion, so that a cleaning space is sealed while a factor such as foreign substances, which may reduce the grip force of the grip surface of the micro LED transfer head, and the foreign substances are prevented from entering into the cleaning space. Thus, only the foreign substances in the cleaning space and foreign substances on the grip surface are present in the cleaning space. The cleaning device can clean the grip surface of the micro LED transfer head without interference of foreign substances which may enter into the cleaning space, thereby improving the cleaning efficiency in the system.

BRIEF DESCRIPTION OF THE DRAWINGS

The above and other objects, features and other advantages of the present invention will be more clearly understood from the following detailed description when taken in conjunction with the accompanying drawings, in which:

FIG. 11A is a view illustrating a state before a system for transferring a micro LED operates according to a third embodiment of the present invention;

FIG. 11B is a view illustrating a state where the system for transferring a micro LED operates according to the third embodiment of the present invention;

FIG. 13A is a view illustrating a state before a system for transferring a micro LED operates according to a fifth embodiment of the present invention;

FIG. 13B is a view illustrating a state where the system for transferring a micro LED operates according to the fifth embodiment of the present invention;

DETAILED DESCRIPTION OF THE INVENTION

Figure 1:
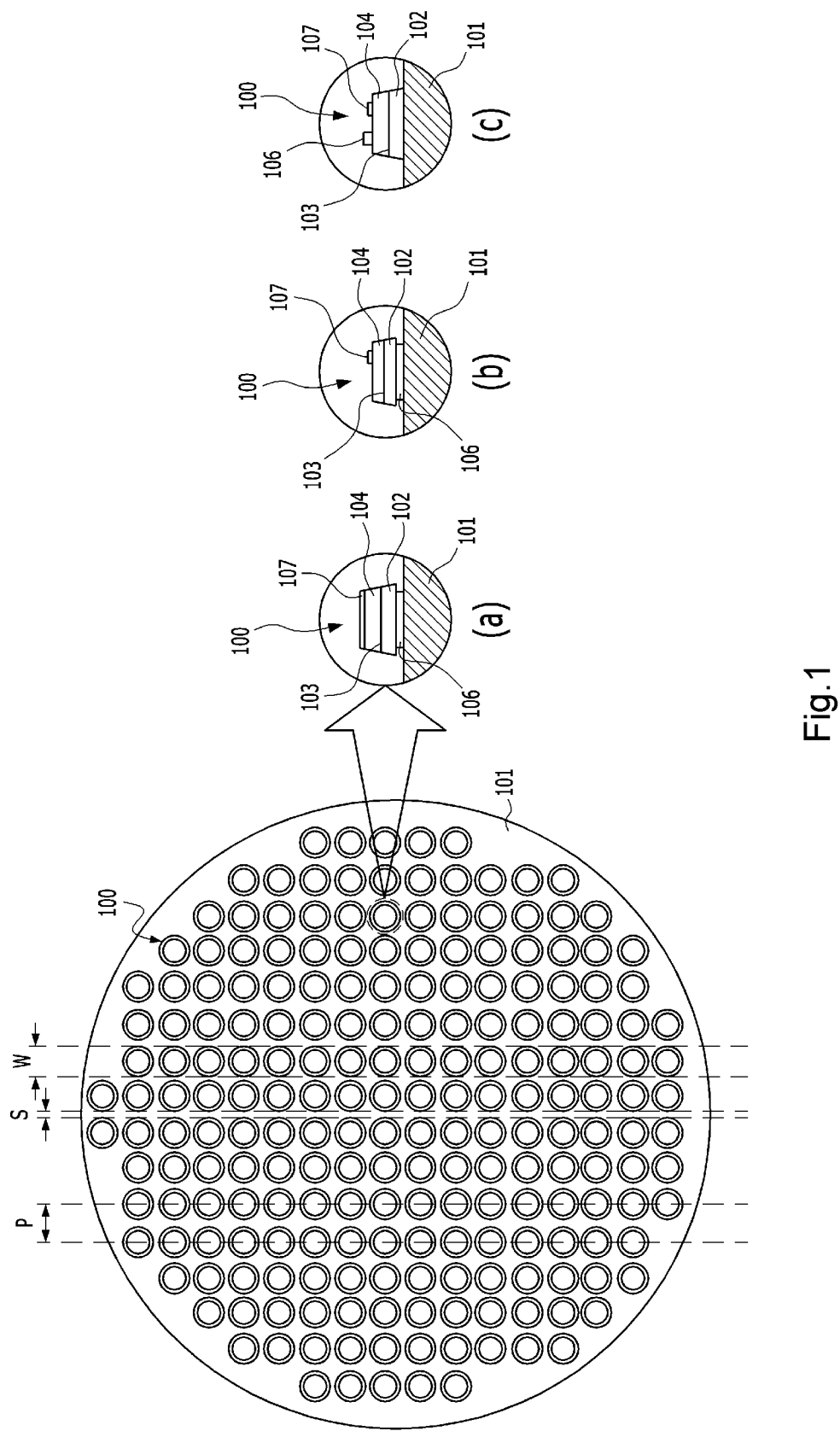
FIG. 1 is a view illustrating micro LEDs to be transferred according to an embodiment of the present invention.

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited to the exemplary embodiments and the conditions.

The above described objectives, features, and advantages will be more apparent through the following detailed description related to the accompanying drawings, and thus those of ordinary skill in the art may easily implement the technical spirit of the invention.

The embodiments of the present invention are described with reference to cross-sectional views and/or perspective views which schematically illustrate ideal embodiments of the present invention. For explicit and convenient description of the technical content, sizes or thicknesses of films and regions and diameters of holes in the figures may be exaggerated. Therefore, variations from the shapes of the illustrations as a result, for example, of manufacturing techniques and/or tolerances, are to be expected. In addition, a limited number of multiple micro LEDs are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

Hereinafter, embodiments of the present invention will be described in detail with reference to the accompanying drawings.

Figure 2:
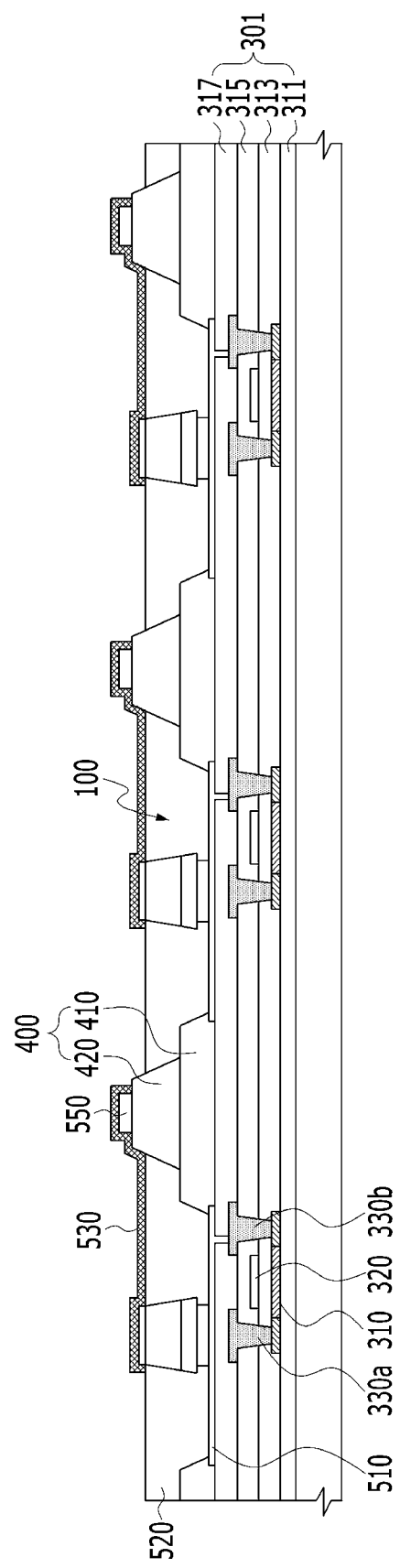
FIG. 2 is a view illustrating a micro LED structure in which the micro LEDs are transferred and mounted to a display substrate according to the embodiment of the present invention.

FIG. 1 is a view illustrating micro LEDs to be transferred according to an embodiment of the present invention; and FIG. 2 is a view illustrating a micro LED structure in which the micro LEDs are transferred and mounted to a display substrate according to the embodiment of the present invention.

FIG. 1 is a view illustrating multiple micro LEDs 100 to be gripped by a micro LED transfer head according to the embodiment of the present invention. The micro LEDs 100 are fabricated and disposed on a growth substrate 101.

The growth substrate 101 may be formed into a conductive substrate or an insulating substrate. For example, the growth substrate 101 is made of at least one selected from among the group consisting of sapphire, SiC, Si, GaAs, GaN, ZnO, GaP, InP, Ge, and $Ga_2O_3$.

Each of the micro LEDs 100 includes: a first semiconductor layer 102; a second semiconductor layer 104; an active layer 103 provided between the first semiconductor layer 102 and the second semiconductor layer 104; a first contact electrode 106; and a second contact electrode 107.

The first semiconductor layer 102, the active layer 103, and the second semiconductor layer 104 may be formed by performing metalorganic chemical vapor deposition (MOCVD), chemical vapor deposition (CVD), plasma-enhanced chemical vapor deposition (PECVD), molecular-beam epitaxy (MBE), hydride vapor phase epitaxy (HVPE), or the like.

The first semiconductor layer 102 may be implemented, for example, as a p-type semiconductor layer. A p-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, AlInN, and the like, and the layer may be doped with a p-type dopant such as Mg, Zn, Ca, Sr, and Ba. The second semiconductor layer 104 may be implemented, for example, as an n-type semiconductor layer. An n-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InNInAlGaN, AlInN, and the like, and the layer may be doped with an n-type dopant such as Si, Ge, and Sn.

However, the present invention is not limited to this. The first semiconductor layer 102 may be implemented as an n-type semiconductor layer, and the second semiconductor layer 104 may be implemented as a p-type semiconductor layer.

The active layer 103 is a region where electrons and holes are recombined. As the electrons and the holes are recombined, the active layer 103 transits to a low energy level and generates light having a wavelength corresponding thereto. The active layer 103 may be formed of a semiconductor material having a composition formula of $In_xAl_yGa_{1-x-y}N$ ($0 \leq x \leq 1$, $0 \leq y \leq 1$, $0 \leq x+y \leq 1$) and may have a single quantum well structure or a multi quantum well (MQW) structure. In addition, the active layer 103 may have a quantum wire structure or a quantum dot structure.

The first semiconductor layer 102 may be provided with the first contact electrode 106, and the second semiconductor layer 104 may be provided with the second contact electrode 107. The first contact electrode 106 and/or the second contact electrode 107 may include one or more layers and may be made of various conductive materials including a metal, conductive oxide, and conductive polymer.

The multiple micro LEDs 100 formed on the growth substrate 101 are separated into individual pieces by cutting along a cutting line using a laser or the like or by etching. Then, it is possible to separate the individual micro LEDs 100 from the growth substrate 101 by a laser lift-off process.

In FIG. 1, the letter 'P' denotes a pitch distance between the micro LEDs 100, 'S' denotes a separation distance between the micro LEDs 100, and 'W' denotes a width of each micro LED 100.

FIG. 2 is a view illustrating a micro LED structure in which the micro LEDs are transferred and mounted to a display substrate by the transfer head for a micro LED according to the embodiment of the present invention.

A display substrate 301 may include various materials. For example, the display substrate 301 may be made of a transparent glass material having $SiO_2$ as a main component. However, materials of the display substrate 301 are not limited to this, and the display substrate 301 may be made of a transparent plastic material and have solubility. The plastic material may be an organic insulating substance selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

In the case of a bottom emission type in which an image is implemented in a direction of the display substrate 301, the display substrate 301 is required to be made of a transparent material. However, in the case of a top emission type in which an image is implemented in a direction opposite to the display substrate 301, the display substrate 301 is not required to be made of a transparent material. In this case, the display substrate 301 may be made of metal.

In the case of forming the display substrate 301 using metal, the display substrate 301 may be made of at least one metal selected from among the group consisting of iron, chromium, manganese, nickel, titanium, molybdenum, stainless steel (SUS), Invar, Inconel, and Kovar, but is not limited thereto.

The display substrate 301 may include a buffer layer 311. The buffer layer 311 provides a flat surface and blocks foreign matter or moisture from penetrating therethrough. For example, the buffer layer 311 may be made of an inorganic substance such as silicon oxide, silicon nitride, silicon oxynitride, aluminum oxide, aluminum nitride, titanium oxide, and titanium nitride, or an organic substance such as polyimide, polyester, and acrylic. Alternatively, the buffer layer 311 may be formed in a stacked manner with the exemplified substances.

A thin-film transistor (TFT) may include an active layer 310, a gate electrode 320, a source electrode 330a, and a drain electrode 330b.

Hereinafter, a case where a TFT is a top gate type in which the active layer 310, the gate electrode 320, the source electrode 330a, and the drain electrode 330b are sequentially formed will be described. However, the present embodiment is not limited thereto, and various types of TFTs such as a bottom gate TFT may be employed.

The active layer 310 may contain a semiconductor material, such as amorphous silicon and polycrystalline silicon. However, the present embodiment is not limited thereto, and the active layer 310 may contain various materials. As an alternative embodiment, the active layer 310 may contain an organic semiconductor material or the like.

As another alternative embodiment, the active layer 310 may contain an oxide semiconductor material. For example, the active layer 310 may contain an oxide of a metal element selected from Groups 12, 13, and 14 elements such as zinc (Zn), indium (In), gallium (Ga), tin (Sn), cadmium (Cd), and germanium (Ge), and a combination thereof.

A gate dielectric layer 313 is formed on the active layer 310. The gate dielectric layer 313 serves to isolate the active layer 310 and the gate electrode 320. The gate dielectric layer 313 may be formed into a multilayer or a single layer of a film made of an inorganic substance such as silicon oxide and/or silicon nitride.

The gate electrode 320 is provided on the gate dielectric layer 313. The gate electrode 320 may be connected to a gate line (not illustrated) applying an on/off signal to the TFT.

The gate electrode 320 may be made of a low-resistivity metal. In consideration of adhesion with an adjacent layer, surface flatness of layers to be stacked, and processability, the gate electrode 320 may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer dielectric film 315 is provided on the gate electrode 320. The interlayer dielectric film 315 isolates the source electrode 330a, the drain electrode 330b, and the gate electrode 320. The interlayer dielectric film 315 may be formed into a multilayer or single layer of a film made of an inorganic substance. For example, the inorganic substance may be a metal oxide or a metal nitride. Specifically, the inorganic substance may include silicon dioxide ($SiO_2$), silicon nitrides ($SiN_x$), silicon oxynitride (SiON), aluminum oxide ($Al_2O_3$), titanium dioxide ($TiO_2$), tantalum pentoxide ($Ta_2O_5$), hafnium dioxide ($HfO_2$), or zirconium dioxide ($ZrO_2$).

The source electrode 330a and the drain electrode 330b are provided on the interlayer dielectric film 315. The source electrode 330a and the drain electrode 330b may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode 330a and the drain electrode 330b are electrically connected to a source region and a drain region of the active layer 310, respectively.

A planarization layer 317 is provided on the TFT. The planarization layer 317 is configured to cover the TFT, thereby eliminating steps caused by the TFT and planarizing the top surface. The planarization layer 317 may be formed into a single layer or a multilayer of a film made of an organic substance. The organic substance may include a general-purpose polymer such as polymethyl methacrylate (PMMA) and polystyrene (PS); a polymer derivative having phenols; polyacrylates; polyimides, poly(aryl ethers); polyamides; fluoropolymers; poly-p-xylenes; and polyvinyl alcohols; and a combination thereof. In addition, the planarization layer 317 may be formed into a multi-stack including an inorganic insulating layer and an organic insulating layer.

A first electrode 510 is provided on the planarization layer 317. The first electrode 510 may be electrically connected to the TFT. Specifically, the first electrode 510 may be electrically connected to the drain electrode 330b through a contact hole formed in the planarization layer 317. The first electrode 510 may have various shapes. For example, the first electrode 510 may be patterned in an island layout. A bank layer 400 defining a pixel region may be disposed on the planarization layer 317. The bank layer 400 may include a recess where each of the micro LEDs 100 will be received. The bank layer 400 may include, for example, a first bank layer 410 defining the recess. A height of the first bank layer 410 may be determined by a height and viewing angle of the micro LED 100. A size (width) of the recess may be determined by resolution, pixel density, and the like, of a display device. In an embodiment, the height of the micro LED 100 may be greater than the height of the first bank layer 410. The recess may have a quadrangular cross section, but is not limited to this. The recess may have various cross section shapes, such as polygonal, rectangular, circular, conical, elliptical, and triangular.

The bank layer 400 may further include a second bank layer 420 on the first bank layer 410. The first bank layer 410 and the second bank layer 420 have a step difference, and a width of the second bank layer 420 may be smaller than the width of the first bank layer 410. A conductive layer 550 may be disposed on the second bank layer 420. The conductive layer 550 may be disposed in a direction parallel to a data line or a scan line, and may be electrically connected to a second electrode 530. However, the present invention is not limited thereto. The second bank layer 420 may be omitted, and the conductive layer 550 may be disposed on the first bank layer 410. Alternatively, the second bank layer 420 and the conductive layer 550 may be omitted, and the second electrode 530 may be formed over the entire display substrate 301 such that the second electrode 530 serves as a shared electrode that pixels (P) share. The first bank layer 410 and the second bank layer 420 may include a material absorbing at least apart of light, a light reflective material, or a light scattering material. The first bank layer 410 and the second bank layer 420 may include an insulating material that is translucent or opaque to visible light (e.g., light in a wavelength range of 380 nm to 750 nm).

For example, the first bank layer 410 and the second bank layer 420 may be made of a thermoplastic such as polycarbonate (PC), polyethylene terephthalate (PET), polyethersulfone, polyvinyl butyral, polyphenylene ether, polyamide, polyetherimide, polynorbornene, poly(methyl methacrylate) resin, and cyclic polyolefin resin; a thermosetting plastic such as epoxy resin, phenolic resin, urethane resin, acrylic resin, vinyl ester resin, polyimide resin, urea resin, and melamine resin; or an organic insulating substance such as polystyrene, polyacrylonitrile, and polycarbonate, but are not limited thereto.

As another example, the first bank layer 410 and the second bank layer 420 may be made of an inorganic insulating substance such as inorganic oxide and inorganic nitride including $SiO_x$, $SiN_x$, $SiN_xO_y$, $AlO_x$, $TiO_x$, $TaO_x$, and $ZnO_x$, but are not limited thereto. In an embodiment, the first bank layer 410 and the second bank layer 420 may be made of an opaque material such as a material of a black matrix. A material of the insulating black matrix may include a resin or a paste including organic resin, glass paste, and black pigment; metal particles such as nickel, aluminum, molybdenum, and alloys thereof; metal oxide particles (e.g., chromium oxide); metal nitride particles (e.g., chromium nitride); or the like. In an alternate embodiment, the first bank layer 410 and the second bank layer 420 may be a distributed Bragg reflector (DBR) having high reflectivity or a mirror reflector made of metal.

Each of the micro LEDs 100 is disposed in each recess. The micro LED 100 may be electrically connected to the first electrode 510 at the recess.

The micro LED 100 emits light having wavelengths of different colors such as red, green, blue, white, and the like. With the micro LED 100, it is possible to realize white light by using fluorescent materials or by combining colors. The micro LED 100 has a size of 1 μm to 100 μm. The micro LEDs 100 are picked up from the growth substrate 101 individually or collectively by a transfer head according to the embodiment of the present invention, transferred to the display substrate 301, and received in the recess of the display substrate 301.

The micro LED 100 includes a p-n diode, the first contact electrode 106 disposed on one side of the p-n diode, and the second contact electrode 107 disposed on the opposite side of the first contact electrode 106. The first contact electrode 106 may be connected to the first electrode 510, and the second contact electrode 107 may be connected to the second electrode 530.

The first electrode 510 may include: a reflective layer made of Ag, Mg, Al, Pt, Pd, Au, Ni, Nd, Ir, Cr, or a compound thereof; and a transparent or translucent electrode layer provided on the reflective layer. The transparent or translucent electrode layer may be made of at least one selected from among the group consisting of indium tin oxide (ITO), indium zinc oxide (IZO), zinc oxide (ZnO), indium oxide ($In_2O_3$), indium gallium oxide (IGO), and aluminum zinc oxide (AZO).

A passivation layer 520 surrounds the micro LED 100 in the recess. The passivation layer 520 covers the recess and the first electrode 510 by filling a space between the bank layer 400 and the micro LED 100. The passivation layer 520 may be made of an organic insulating substance. For example, the passivation layer 520 may be made of acrylic, poly (methyl methacrylate) (PMMA), benzocyclobutene (BCB), polyimide, acrylate, epoxy, and polyester, but is not limited thereto.

The passivation layer 520 is formed to have a height not covering an upper portion of the micro LED 100, for example, a height not covering the second contact electrode 107, whereby the second contact electrode 107 is exposed. The second electrode 530 may be formed on the passivation layer 520 electrically connected to the exposed second contact electrode 107 of the micro LED 100.

The second electrode 530 may be disposed on the micro LED 100 and the passivation layer 520. The second electrode 530 may be made of a transparent conductive substance such as ITO, IZO, ZnO, and $In_2O_3$.

First Embodiment

Figure 3:
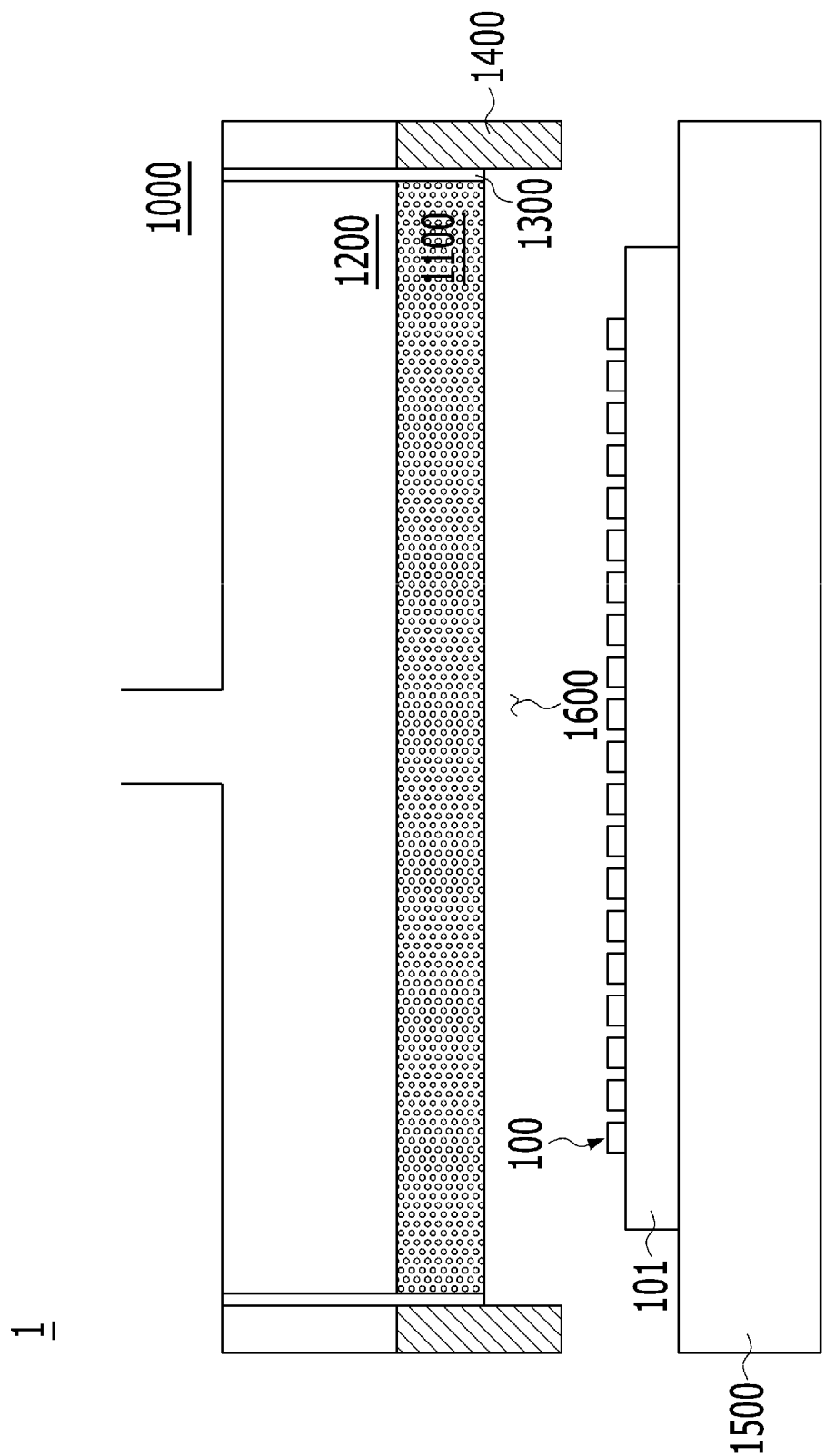
FIG. 3 is a view illustrating a state before a system for transferring a micro LED operates according to a first embodiment of the present invention.
Figure 4:
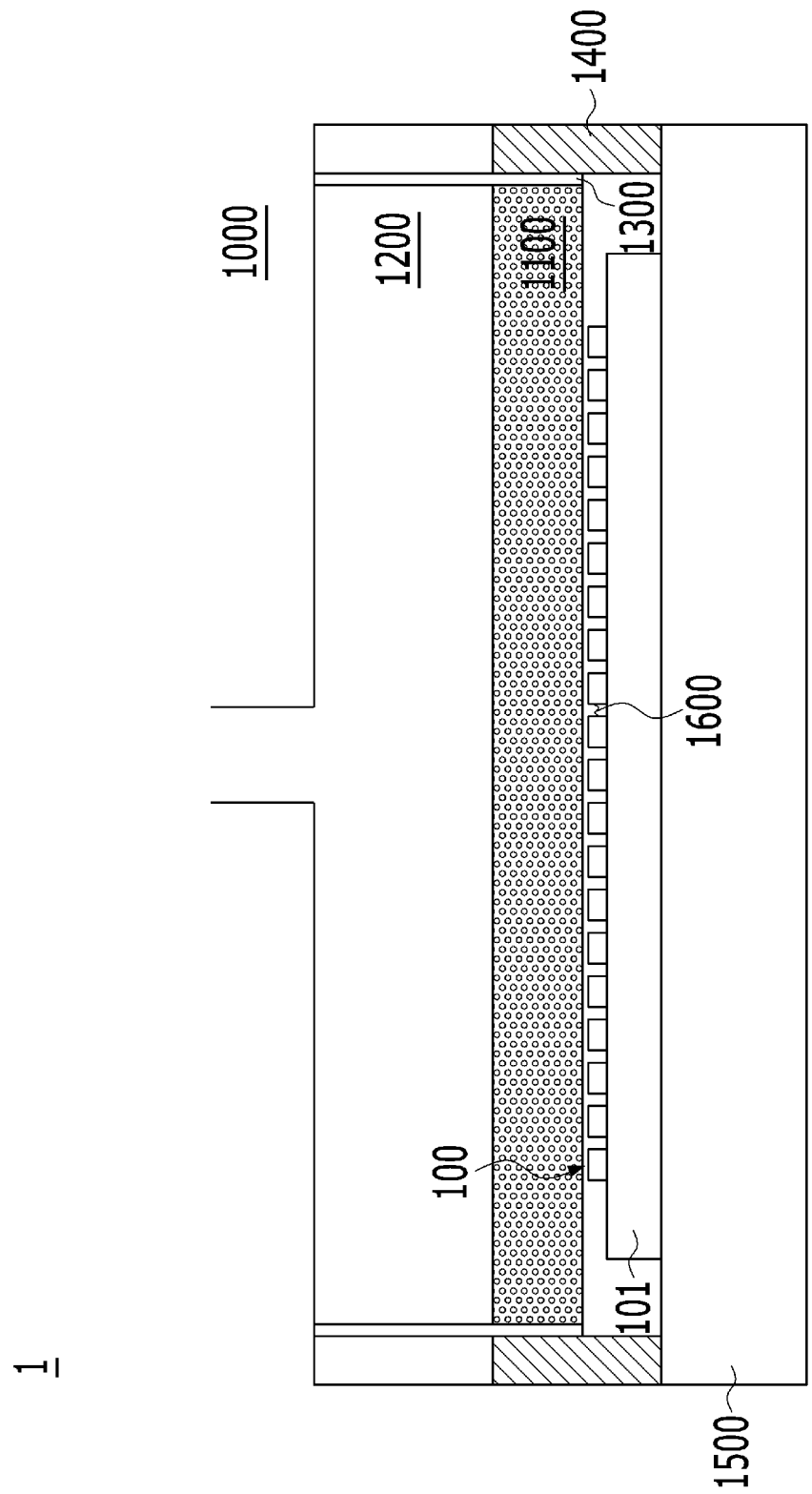
FIG. 4 is a view illustrating a state where the system for transferring a micro LED operates according to the first embodiment of the present invention.

FIG. 3 is a view illustrating a state before a micro LED transfer head 1000 of a system 1 for transferring a micro LED descends according to a first embodiment of the present invention; FIG. 4 is a view illustrating a state after the micro LED transfer head 1000 of the system 1 for transferring a micro LED descends according to the first embodiment of the present invention; and FIGS. 5A to 5D are views illustrating an operation sequence of the system 1 for transferring a micro LED according to the first embodiment of the present invention.

The system 1 for transferring a micro LED according to the first embodiment of the present invention includes: the micro LED transfer head 1000 including a porous member 1100 having pores and serving as a grip surface and the transfer head 1000 also including a support 1400 configured on a periphery of the micro LED transfer head 1000 in a manner protruding downward beyond the grip surface; a first substrate 101 on which the micro LEDs 100 are formed; and a support member 1500 provided underneath the first substrate 101 to support the first substrate 101. The first substrate 101 of the first embodiment may be the same substrate as the growth substrate 101 of FIG. 1, which is a substrate on which the micro LEDs 100 are fabricated. Therefore, the same reference numerals are used in the drawings referred to in the following description.

The micro LED transfer head 1000 constituting the system 1 for transferring a micro LED according to the first embodiment of the present invention will be described with reference to FIGS. 3 and 4.

Since the micro LED transfer head 1000 includes the porous member 1100 having the pores and serving as the grip surface and also includes the support 1400 configured on the periphery of the micro LED transfer head 1000 in a manner protruding downward beyond the grip surface, the micro LED transfer head 1000 can grip or detach the micro LEDs 100 by applying a vacuum to the pores of the porous member 1100 or releasing the vacuum applied to the pores, respectively.

A vacuum chamber 1200 is provided on the porous member 1100. The vacuum chamber 1200 is connected to a vacuum port providing vacuum or releasing the vacuum. The vacuum chamber 1200 functions to apply a vacuum to the multiple pores of the porous member 1100 or release the vacuum applied to the pores according to the operation of the vacuum port. A structure of engaging the vacuum chamber 1200 with the porous member 1100 is not limited as long as the structure is suitable for preventing gas or air from leaking to other parts when applying the vacuum to the porous member 1100 or releasing the applied vacuum.

In order to vacuum-suck the micro LEDs 100, the vacuum applied to the vacuum chamber 1200 is transferred to the multiple pores of the porous member 1100 to generate a vacuum suction force for the micro LEDs 100. Accordingly, a lower surface of the porous member 1100 may serve as the grip surface gripping the micro LEDs 100.

In order to detach the micro LEDs 100, the vacuum applied to the vacuum chamber 1200 is released to remove the vacuum from the multiple pores of the porous member 1100 whereby the vacuum suction force to the micro LEDs 100 is removed.

The porous member 1100 may be composed of a material containing a large number of pores therein and may be configured as powders, a thin film, a thick film, or a bulk form having a porosity of about 0.2 to 0.95 in a predetermined arrangement or disordered pore structure. The pores of the porous member 1100 are classified according to pore sizes thereof: micropores having a pore diameter of 2 nm or less, mesopores having a pore diameter of 2 nm to 50 nm, and macropores having a pore diameter of 50 nm or more. The porous member 1100 may include at least some of micropores, mesopores, and macropores. Porous materials of the porous member 1100 are classified according to constituent components thereof: organic, inorganic (ceramic), metal, and hybrid type.

The porous member 1100 includes an anodic oxide film in which pores are formed in a predetermined arrangement. The anodic oxide film is a film formed by anodizing a metal that is a base material, and pores are pores formed in a process of forming the anodic oxide film by anodizing the metal. For example, in a case that the base metal is aluminum (Al) or an aluminum alloy, the anodization of the base material forms the anodic oxide film consisting of anodized aluminum ($Al_2O_3$) on a surface of the base material. The anodic oxide film formed as described above includes a barrier layer in which the pores are not formed and a porous layer in which the pores are formed inside. The barrier layer is positioned on an upper portion of the base material, and the porous layer is positioned on the barrier layer. After removing the base material on which the anodic oxide film having the barrier layer and the porous layer is formed, only anodic oxide film consisting of anodized aluminum ($Al_2O_3$) remains.

The anodic oxide film has the pores configured vertically and having a regular arrangement with a uniform diameter. Accordingly, after removing the barrier layer, the pores have a structure extending from top to bottom vertically, thereby facilitating the generation of the vacuum pressure in the vertical direction.

The inside of the anodic oxide film forms an air flow path vertically by the vertical pores. An internal width of the pores has a size of several nanometers to several hundred nanometers. For example, when a size of the micro LED 100 to be vacuum-sucked is 30 μm×30 μm and an internal width of the pores is several nanometers, it is possible to vacuum-suck the micro LEDs 100 by approximately tens of millions of pores.

When a size of the micro LED 100 to be vacuum-sucked is 30 μm×30 μm and an internal width of the pores is several hundred nanometers, it is possible to vacuum-suck the micro LEDs 100 by approximately tens of thousands of pores. The micro LEDs 100 are lightweight because each of the micro LEDs 100 are fundamentally configured with the first semiconductor layer 102, the second semiconductor layer 104, the active layer 103 provided between the first semiconductor layer 102 and the second semiconductor layer 104, the first contact electrode 106, and the second contact electrode 107. Accordingly, it is possible to grip the micro LEDs 100 by tens of thousands to tens of millions of pores formed in the anodic oxide film by vacuum-suction.

The porous member 1100 is configured as powders, a coating film, or bulk form. The powder may have various shapes such as a sphere, a hollow sphere, a fiber, and a tube. The powder may be used as it is in some cases, but it is also possible to prepare a coating film or a bulk form with the powder as a starting material.

In addition, the porous member 1100 may be configured to have two porous members including first and second porous members. The second porous member is provided on the first porous member. The first porous member functions to vacuum-suck the micro LEDs 100. The second porous member is disposed between the vacuum chamber and the first porous member to transfer the vacuum pressure of the vacuum chamber to the first porous member.

The first and second porous members may have different porosity characteristics. For example, the first and second porous members have different characteristics in the arrangement and size of the pores, the material and the shape of the porous member.

With respect to the arrangement of the pores, one of the first and second porous members may have a uniform arrangement of pores and the other may have a disordered arrangement of pores. With respect to the size of the pores, any one of the first and second porous members may have a larger pore size than the other. Here, the size of the pores may be the average size of the pores or may be the maximum size of the pores. With respect to the material of the porous member, one of the first and second porous members may be formed of one of organic, inorganic (ceramic), metal, and hybrid type porous materials, and the other one may be formed of one of organic, inorganic (ceramic), metal, and or hybrid type porous material different from the first material. In terms of the shape of the porous member, the first and second porous members may have different shapes.

By varying the arrangement, size, material, and shape of the pores of the first and second porous members as described above, the micro LED transfer head 1000 has various functions and each of the first and second porous members performs complementary functions. The number of the porous members is not limited to two as in the case of the first and second porous members. As long as individual porous members have mutually complementary functions, providing two or more porous members also falls into the scope of the embodiment of the present invention.

When the pores of the porous member 1100 have a disordered pore structure, the multiple pores are connected to each other inside the porous member 1100 such that air flow paths are formed and connect upper and lower portions of the porous member 1100. When the pores of the porous member 1100 have a vertical pore structure, the inside of the porous member 1100 is pierced from top to bottom by the vertical pores such that air flow paths are formed.

In the case the first porous member is embodied by an anodic oxide film having pores formed by anodizing a metal, the second porous member may be embodied by a porous scaffold functioning to support the first porous member. A material of the second porous member is not limited as long as the second porous member made of a material functions to support the first porous member. The second porous member may have the above-mentioned configuration of the porous member 1100. The second porous member may be embodied by a rigid porous scaffold capable of preventing sagging at the center portion of the first porous member. For example, the second porous member may be made of a porous ceramic material.

The micro LED transfer head 1000 includes the support 1400 configured on the periphery of the micro LED transfer head 1000 in a manner protruding downward beyond the grip surface of the porous member 1100.

As illustrated in FIG. 3, the support 1400 is configured on the periphery of the micro LED transfer head 1000 in a manner protruding downward beyond the grip surface of the porous member 1100. Here, the periphery of the micro LED transfer head 1000 may indicate an outer portion on the micro LED transfer head 1000, which corresponds to a micro LED present area where the micro LEDs 100 are formed on the upper surface of the first substrate 101.

When the micro LED transfer head 1000 descends to vacuum-suck the micro LEDs 100, the support 1400 configured on the periphery of the micro LED transfer head 1000 prevents a problem that the micro LEDs 100 are not gripped and transferred and prevents the micro LEDs 100 located on the edge side of the first substrate 101 from being shaken due to a vortex generated by the outside air, thereby improving the transfer efficiency.

When the micro LED transfer head grips the micro LEDs, a vortex is generated due to the difference between the vacuum pressure of the micro LED transfer head and the ambient air, so that the micro LEDs of the growth substrate such as the first substrate may be shaken. As a result, the efficiency of the micro LED transfer head transferring the micro LEDs may be lowered.

As illustrated in FIG. 4, when the micro LED transfer head 1000 having the support 1400 configured on the periphery of the micro LED transfer head 1000 in a manner protruding downward beyond the grip surface of the porous member 1100 according to the present invention descends toward the upper surfaces of the micro LEDs 100, the support 1400 is brought into contact with an upper surface of the support member 1500 of the support member 1500.

The support 1400 may seal a transfer space 1600 where the lower end of the micro LED transfer head 1000 and the upper surfaces of the micro LEDs 100 of the first substrate 101 are spaced apart from each other when the micro LED transfer head 1000 descends and the micro LEDs 100 are transferred onto the grip surface of the porous member 1100. Therefore, it is possible to prevent the micros LED 100 from being shaken due to the inflow of the outside air during the transfer of the micro LEDs 100 onto the grip surface of the micro LED transfer head 1000, thereby improving the transfer efficiency.

The support 1400 may be made of an elastic material.

As illustrated in FIG. 4, when the micro LED transfer head 1000 descends to transfer the micro LEDs 100 of the first substrate 101 onto the grip surface of the porous member 1100, the support 1400 configured on the periphery of the micro LED transfer head 1000 is brought into contact with the upper surface of the support member 1500. Since the support 1400 is configured on the periphery of the micro LED transfer head 1000 to protrude downward beyond the grip surface, the lower surface of the support 1400 and the upper surface of the support member 1500 are brought into contact with each other when the micro LED transfer head 1000 descends. As a result, the transfer space 1600 is sealed.

The transfer space 1600 sealed by the support 1400 is prevented from inflow of the outside air such that an environment is created where the micro LEDs 100 can be effectively vacuum-sucked.

The micro LED transfer head 1000 provides the vacuum pressure through the vacuum chamber 1200 to decompress the transfer space 1600. As the transfer space 1600 is in the reduced pressure state, the support 1400 made of an elastic material is elastically deformed and the height thereof is lowered. The height of the support 1400 is elastically deformed so that the grip surface of the porous member 1100 and the upper surfaces of the micro LEDs 100 are brought into contact with each other, and the micro LEDs 100 are transferred onto the grip surface of the micro LED transfer head 1000.

The support 1400 made of an elastic material seals the transfer space 1600 whereby the transfer efficiency of the system 1 for transferring a micro LED is increased. In addition, the support 1400 serves as a buffer between the micro LED transfer head 1000 and the micro LEDs 100. A transfer error may occur due to a mechanical tolerance of the micro LED transfer head 1000 when the micro LED transfer head 1000 descends. However, as the support 1400 made of an elastic material contacts the upper surface of the support member 1500, the support 1400 is elastically deformed, thereby accommodating the mechanical tolerance of the micro LED transfer head 1000. As a result, it is possible to prevent collision between the grip surface of the micro LED transfer head 1000 and the upper surfaces of the micro LEDs 100. In addition, when the transfer space 1600 is in the reduced pressure state, the grip surface of the micro LED transfer head 1000 and the upper surfaces of the micro LEDs 100 are close to each other gradually and brought into contact with each other, so that the micro LEDs 100 are gripped and transferred.

In addition, the support 1400 may be embodied by a porous member.

When the support 1400 is embodied by a porous member having pores, the support 1400 can seal the transfer space 1600 while introducing a small amount of outside air through the pores. As a result, the support 1400 can seal the transfer space 1600 while relieving the sudden rise of the vacuum pressure as the transfer space 1600 is sealed.

In addition, when the support 1400 is embodied by a porous member, it is possible to prevent occurrence of a vortex in the transfer space 1600, which may be caused by high vacuum state. For example, when the system for transferring a micro LED uses a high-vacuum pump and forms the transfer space in a high vacuum state to increase the vacuum-suction force, a vortex is generated in the transfer space due to the high vacuum state, causing the micro LEDs to be shaken or the micro LEDs not to be gripped.

As described above, as the micro LED transfer head 1000 having the support 1400 embodied by a porous member descends, the transfer space 1600 is sealed by the support 1400 and a small amount of outside air is introduced into the transfer space 1600. Accordingly, it is possible to prevent the occurrence of a vortex in the transfer space 1600 which may be caused by high vacuum state and to transfer the micro LEDs 100 onto the grip surface.

Although the horizontal area of the first substrate 101 is illustrated in FIGS. 3 to 5D as being smaller than the horizontal area of the upper surface of the support member 1500 supporting the first substrate 101, the horizontal area of the first substrate 101 may be equal to the horizontal area of the upper surface of the support member 1500 so that the support 1400 is brought into contact with the upper surface of the first substrate 101, and thus the transfer space 1600 is sealed.

As illustrated in FIGS. 3 to 5D, the system 1 for transferring a micro LED according to the first embodiment of the present invention is configured such that the micro LED transfer head 1000 includes a passage 1300 through which the outside air is introduced into the transfer space 1600 defined while the lower end of the micro LED transfer head 1000 and the upper surfaces of the micro LEDs 100 of the first substrate 101 are spaced apart from each other.

The passage 1300 provided in the micro LED transfer head 1000 may be provided at an inner side of the support 1400 configured on the periphery of the micro LED transfer head 1000. The passage 1300 may be provided at an inner side of the support 1400 on the periphery side of the micro LED transfer head 1000 in a manner being configured in a manner that extends from top to bottom of the micro LED transfer head 1000 vertically.

When the support 1400 is sealed while being in contact with the upper surface of the support member 1500, the passage 1300 lowers the vacuum pressure of the transfer space 1600 by introducing the outside air into the transfer space 1600, so that the micro LED transfer head 1000 can be easily raised. The passage 1300 is provided with an opening means (not illustrated) being opened to introduce the outside air when the micro LED transfer head 1000 is raised or being closed when the micro LED transfer head 1000 transfers the micro LEDs 100. Therefore, during the transfer of the micro LEDs 100, the outside air is not introduced into the transfer space 1600, and the transfer efficiency in the transfer space 1600 sealed by the support 1400 can be maintained. The opening means of the passage 1300 may be a slide type cover. Alternatively, in the case the passage 1300 is formed in a circular tube, the opening means of the passage 1300 may be in a form of a conical stopper which can be detachably coupled to an upper portion of the passage 1300.

Figure 5A:
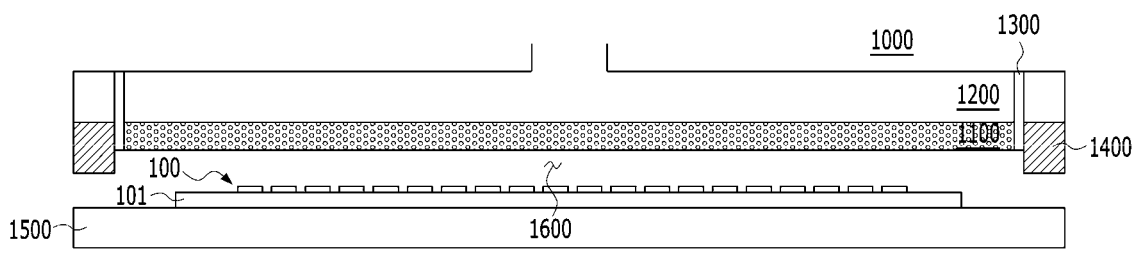
FIGS. 5A to 5D are views illustrating an operation sequence of the system for transferring a micro LED according to the first embodiment of the present invention.

As illustrated in FIG. 5A, the system 1 for transferring a micro LED according to the first embodiment includes: the micro LED transfer head 1000 including the support 1400 and the passage 1300; the first substrate 101 on which the micro LEDs 100 are formed; and the support member 1500 provided underneath the first substrate 101 to support the first substrate 101.

Figure 5B:
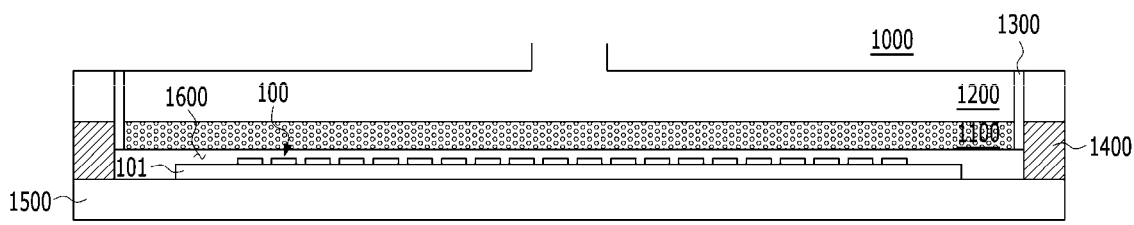

As illustrated in FIG. 5B, the micro LED transfer head 1000 of the first embodiment descends such that the support 1400 is brought into contact with the upper surface of the support member 1500. As a result, the transfer space 1600 is sealed. The lowered micro LED transfer head 1000 transmits vacuum supplied through the vacuum chamber 1200 to the multiple pores of the porous member 1100 such that the vacuum grip force is generated in the porous member 1100.

Figure 5C:
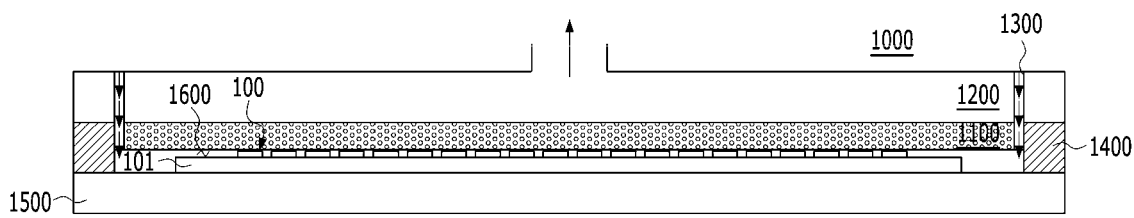

Arrows pointing upward at an upper middle portion of the micro LED transfer head 1000 in FIG. 5C may indicate an inside air discharged from the transfer space 1600. The micro LEDs 100 are transferred onto the grip surface of the porous member 1100 by the vacuum supplied through the vacuum chamber 1200. Then, as illustrated in FIG. 5C, the opening means of the passage 1300 is opened to introduce the outside air through the passage 1300. The arrows illustrated in the passage 1300 may indicate the outside air being introduced into the transfer space 1600 through the passage 1300.

Figure 5D:
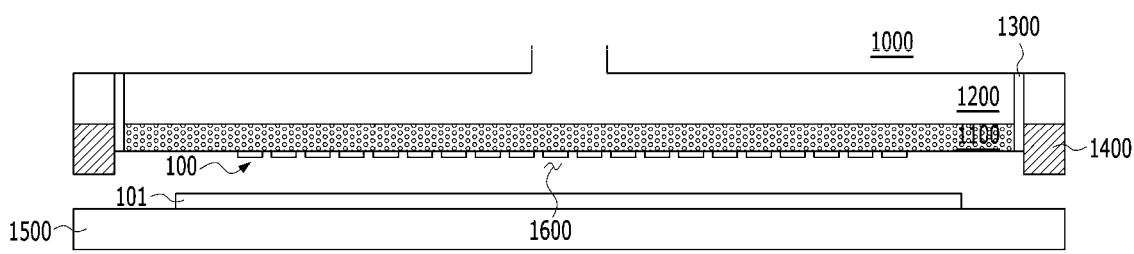

In the system 1 for transferring a micro LED of the first embodiment, the vacuum pressure of the transfer space 1600 on the support 1400 side is lowered due to the outside air introduced through the passage 1300 provided at the inner side of the support 1400 on the periphery side of the micro LED transfer head 1000. Accordingly, the lower surface of the support 1400 can be easily detached from the upper surface of the support member 1500, and the micro LED transfer head 1000 can be raised with the micro LEDs 100 transferred onto the micro LED transfer head 1000 as illustrated in FIG. 5D.

Figure 6:
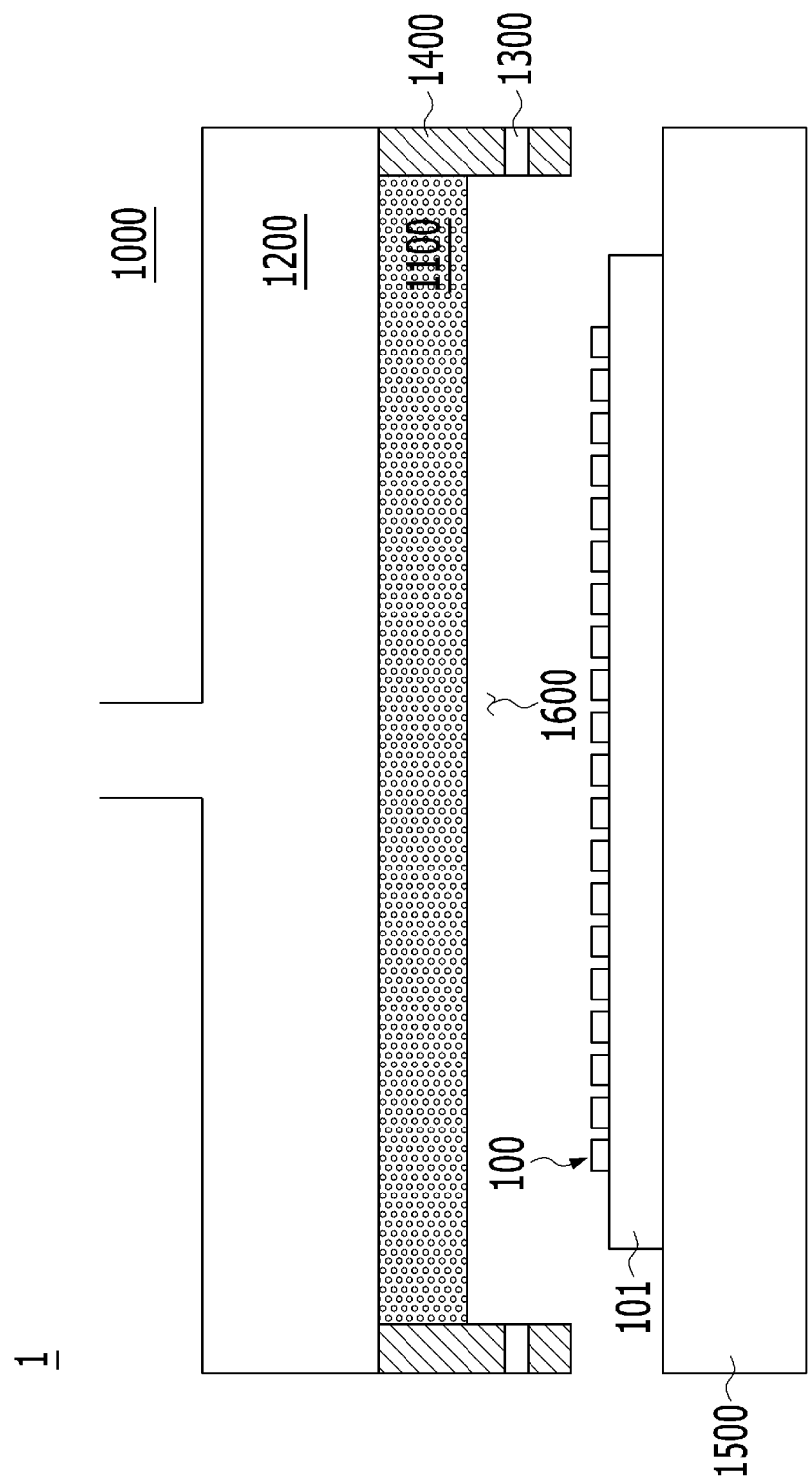
FIG. 6 is a view illustrating a first modification of the system for transferring a micro LED according to the first embodiment of the present invention.

FIG. 6 is a view illustrating a first modification of the system 1 for transferring a micro LED according to the first embodiment of the present invention. A position of the passage 1300 in the first modification of the first embodiment differs from that of the first embodiment. The passage 1300 according to the first embodiment is provided in the micro LED transfer head 1000 constituting the system 1 for transferring a micro LED, whereas the passage 1300 according to the first modification of the first embodiment is provided at the support 1400.

In the first modification of the first embodiment, the passage 1300 is provided at a lower portion of the support 1400 configured on the periphery of the micro LED transfer head 1000 in a manner protruding downward beyond the grip surface. Since the lower portion of the support 1400 is a portion protruding beyond the grip surface of the porous member 1100 of the micro LED transfer head 1000, the passage 1300 may be provided at a protruding portion of the support 1400. Since the protruding portion of the support 1400 seals the transfer space 1600 closely, the protruding portion may be a suitable position for providing the passage 1300 through which the outside air is introduced into the transfer space 1600.

As described above, since the passage 1300 is provided at the protruding portion of the support 1400 which directly seals the transfer space 1600 in the first modification of the first embodiment, the vacuum pressure of the transfer space 1600 is lowered by the passage 1300. Accordingly, it is possible to facilitate detaching the lower surface of the support 1400 from the upper surface of the support member 1500 and to raise the micro LED transfer head 1000 with the micro LEDs 100 vacuum-sucked onto the micro LED transfer head 1000.

Figure 7:
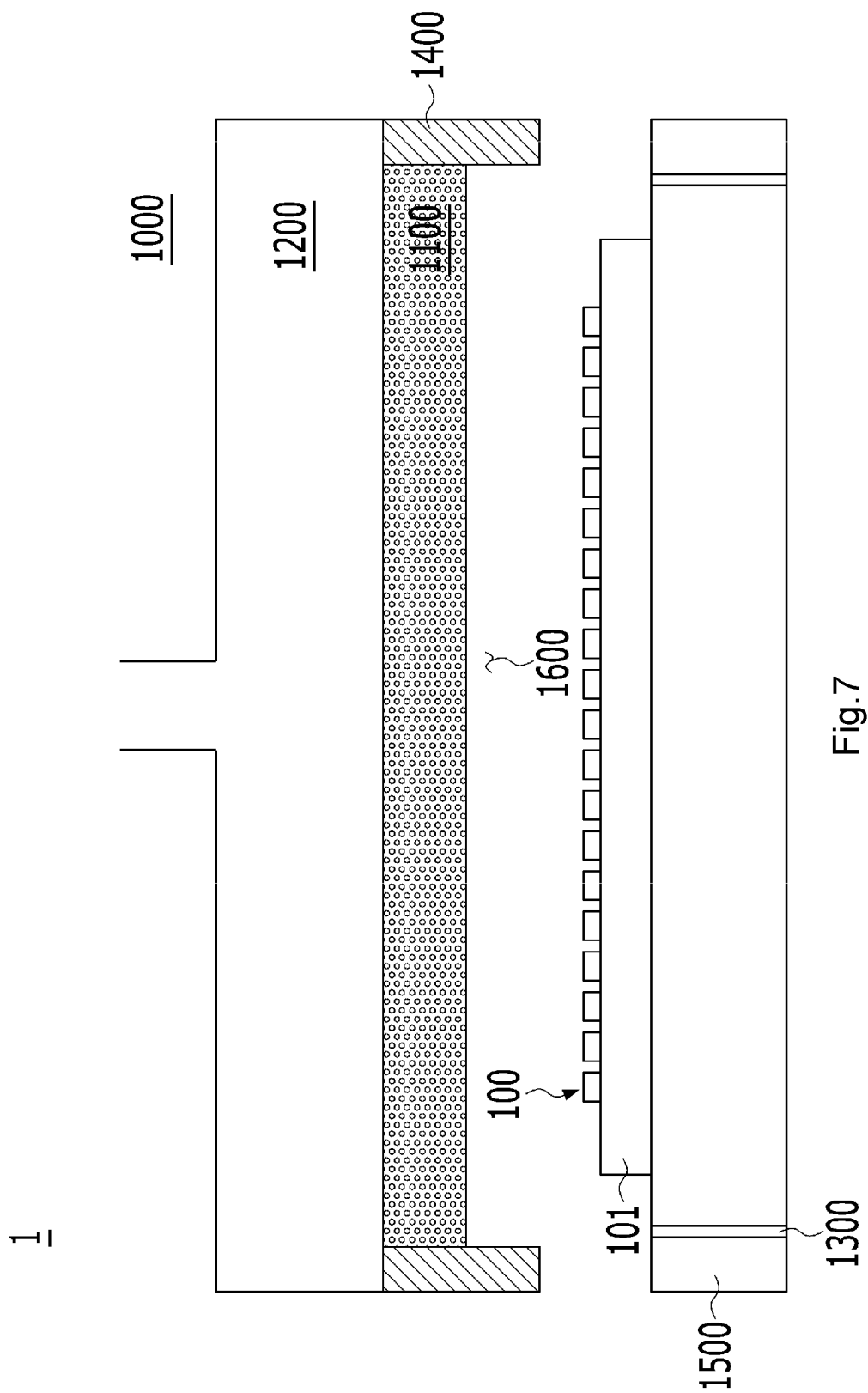
FIG. 7 is a view illustrating a second modification of the system for transferring a micro LED according to the first embodiment of the present invention.

FIG. 7 is a view illustrating a second modification of the system 1 for transferring a micro LED according to the first embodiment of the present invention. The second modification of the first embodiment differs from the first embodiment in that the passage 1300 through which the outside air is introduced into the transfer space 1600 according to the second modification of the first embodiment is provided at the support member 1500 supporting the first substrate 101.

In the second modification of the first embodiment, the passage 1300 is configured to extend from top to bottom of the support member 1500 vertically on the edge side of the support member 1500 supporting the first substrate 101. As illustrated in FIG. 7, the passage 1300 of the second modification of the first embodiment may be provided at the edge side of the support member 1500 and provided at a position corresponding to the inner side of the support 1400 configured on the periphery of the micro LED transfer head 1000 in a manner protruding downward beyond the grip surface. Here, the position corresponding to the inner side of the support 1400 may be a position corresponding to the periphery of the grip surface of the porous member 1100. The periphery of the grip surface of the porous member 1100 may indicate an outer portion of the micro LED present area where the micro LEDs 100 vacuum-sucked on the grip surface of the porous member 100 exist.

In the case the passage 1300 is provided at the support member 1500 according to the second modification of the first embodiment, a horizontal area of the first substrate 101 is required to be smaller than the horizontal area of the upper surface of the support member 1500. This is because the passage 1300 provided at the edge side of the support member 1500 can easily introduce the outside air into the transfer space 1600. In the case the passage 1300 is provided at the edge side of the support member 1500, the horizontal area of the first substrate 101 is preferably smaller than the horizontal area of the upper surface of the support member 1500.

With the configuration of the second modification, the outside air is introduced into the transfer space 1600 such that the lower surface of the support 1400 is detached from the upper surface of the support member 1500. Accordingly, the micro LED transfer head 1000 can be raised easily while the micro LEDs 100 are transferred thereon.

Second Embodiment

Hereinafter, a second embodiment of the present invention will be described. It should be noted that the embodiment described below will be described with particular emphasis on characteristic components as compared with the first embodiment, and descriptions of the same or similar components as those of the first embodiment will be omitted.

Figure 8:
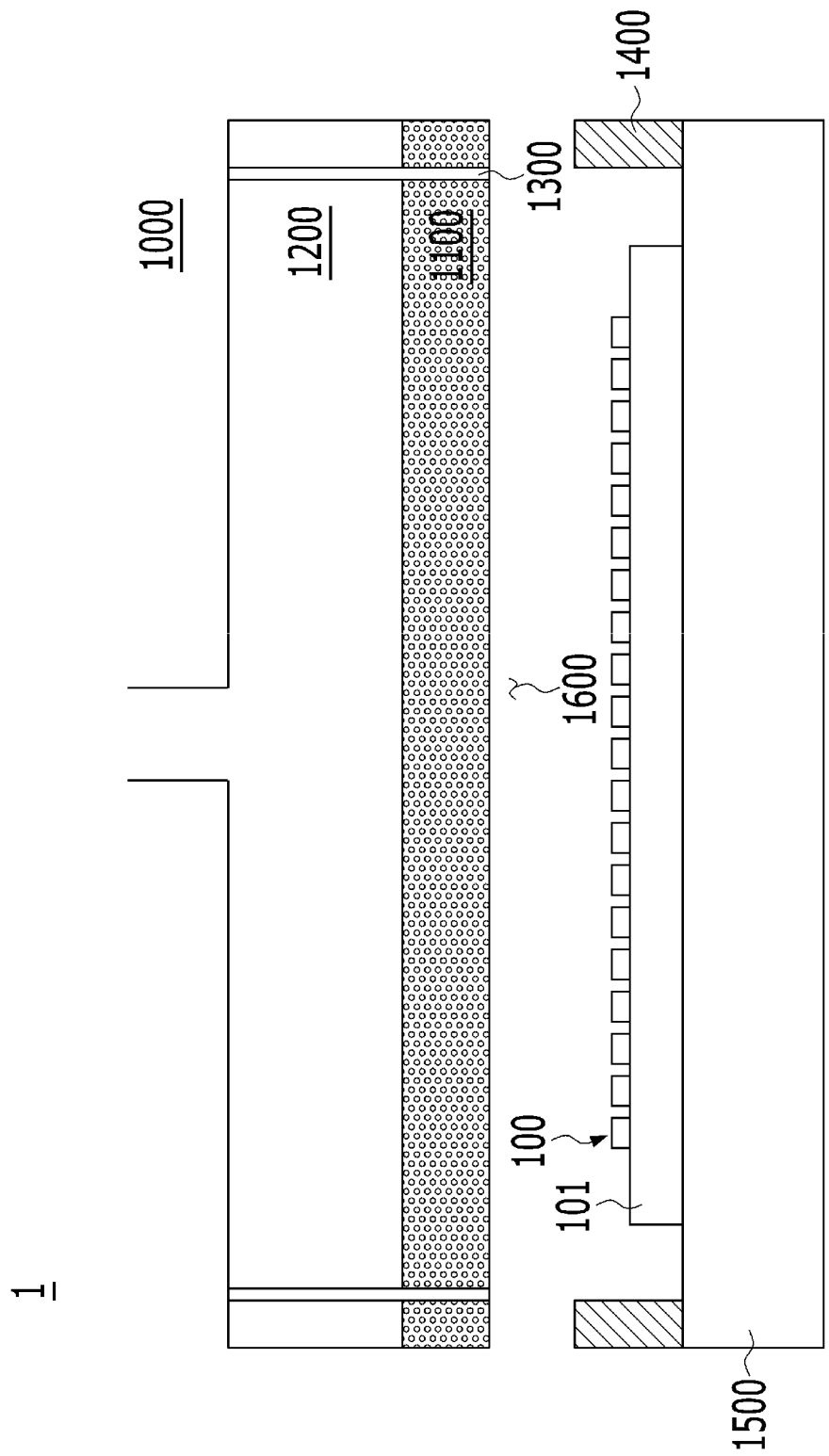
FIG. 8 is a view illustrating a system for transferring a micro LED according to a second embodiment of the present invention.

FIG. 8 is a view illustrating a system 1 for transferring a micro LED according to a second embodiment of the present invention.

The system 1 for transferring a micro LED according to the second embodiment is characterized in that a support 1400 is provided at the support member 1500 whereas the support 1400 of the first embodiment is provided at the micro LED transfer head 1000.

The system 1 for transferring a micro LED according to the second embodiment of the present invention includes: a micro LED transfer head 1000 including a porous member 1100 having pores and serving as a grip surface; a first substrate 100 on which micro LEDs 100 are formed; and a support member 1500 supporting the first substrate 101.

As illustrated in FIG. 8, the support 1400 is configured on a periphery of the support member 1500 in a manner protruding upward from the support member 1500. Here, the periphery of the support member 1500 may indicate the outside of the first substrate 101 provided on the upper surface of the support member 1500. When the micro LED transfer head 1000 descends toward upper surfaces of the micro LEDs 100 formed on the first substrate 101 supported by the support member 1500 in order to transfer the micro LEDs 100 onto the grip surface of the porous member 1100 of the micro LED transfer head 1000, the support 1400 configured on the periphery of the support member 1500 in a manner protruding upward is brought into contact with a periphery of the lower surface of the micro LED transfer head 1000. Since the support 1400 is configured on the periphery of the support member 1500 in a manner protruding upward, the upper surface of the support 1400 is brought into contact with the lower surface of the periphery of the micro LED transfer head 1000. Thus, the transfer space 1600 is sealed, which is defined while the lower end of the micro LED transfer head 1000 is spaced apart from the upper surfaces of the micro LEDs 100 of the first substrate 101.

The support 1400 is made of an elastic material such that, when the transfer space 1600 is in a vacuum state, the support 1400 is elastically deformed and the height thereof is lowered. Due to the support 1400 of which the height is lowered due to the elastic deformation, the grip surface of the micro LED transfer head 1000 comes into contact with the upper surfaces of the micro LEDs 100 such that the micro LEDs 100 are transferred onto the grip surface of the micro LED transfer head 1000. In addition, the support 1400 made of an elastic material may serve as a buffer to prevent the micro LEDs 100 from being damaged by a transfer error of the micro LED transfer head 1000.

In addition, since the support 1400 is made of a porous member, the support 1400 seals the transfer space 1600 and relieves the sudden rise of the vacuum pressure in the transfer space 1600 at the same time by introducing a small amount of outside air. The support 1400 performs more effectively when a high vacuum pump is used.

After transferring the micro LEDs 100 onto the grip surface of the micro LED transfer head 1000 from the transfer space 1600 sealed by the support 1400, the micro LED transfer head 1000 is raised to transfer the micro LEDs 100 to a second substrate, which may be the display substrate 301 illustrated in FIG. 2 or a temporary substrate at an intermediate position. In this case, since the support 1400 is in contact with a periphery of the lower surface of the micro LED transfer head 1000 onto which the micro LEDs 100 are transferred and in contact with a periphery of the grip surface of the porous member 1100 and vacuum-sucked, the raising of the micro LED transfer head 1000 is interrupted thereby. Accordingly, it is preferable that the micro LED transfer head 1000 has a passage 1300 into which the outside air is introduced into the sealed transfer space 1600.

The passage 1300 is provided in the micro LED transfer head 1000. Specifically, the passage 1300 is configured at the edge side of the micro LED transfer head 1000 and at a position corresponding to an inner side of the support 1400 configured on the periphery of the support member 1500 in a manner that extends from top to bottom of the transfer head 1000 vertically. The position corresponding to the inner side of the support 1400 may correspond to a position on the upper surface of the support member 1500 between the outer portion of the first substrate 101 provided on the upper surface of the support member 1500 and the support 1400.

The passage 1300 is provided with an opening means (not illustrated) being closed when the micro LED transfer head 1000 performs the transfer or being opened after the micro LEDs 100 are transferred onto the micro LED transfer head 1000. According to the present invention, the outside air is introduced into the transfer space 1600 through the opened passage 1300 to lower the vacuum pressure in the transfer space 1600. Accordingly, it is possible to raise the micro LED transfer head 1000 with the micro LEDs 100 transferred onto the micro LED transfer head 1000 and to transfer the micro LEDs 100 onto the second substrate.

In the second embodiment, since the passage 1300 is provided in the micro LED transfer head 1000 and the support 1400 is configured on the periphery of the first substrate 101 in a manner that protrudes upward from the first substrate 101, it is possible to seal the transfer space 1600 when the transfer head 1000 descends. In the case the support 1400 is configured on the periphery of the first substrate 101 in a manner that protrudes upward from the first substrate 101, the periphery of the first substrate 101 may indicate an outer portion of the micro LED present area where the micro LEDs 100 are present.

Figure 9:
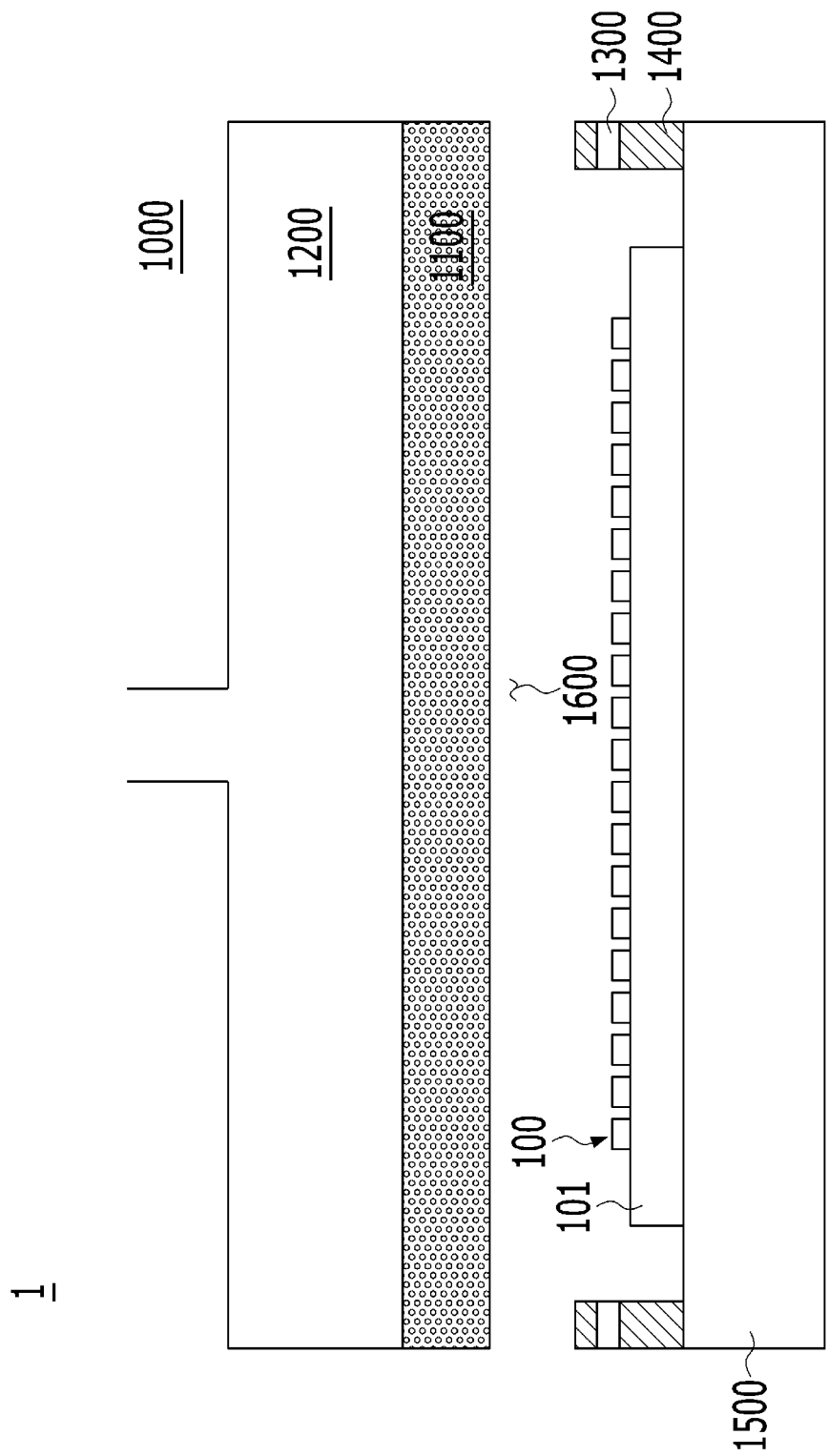
FIG. 9 is a view illustrating a first modification of the system for transferring a micro LED according to the second embodiment of the present invention.

FIG. 9 is a view illustrating a first modification of the system 1 for transferring a micro LED according to the second embodiment of the present invention. The first modification of the second embodiment differs from the second embodiment in that the passage 1300 through which the outside air is introduced into the transfer space 1600 according to the first modification of the second embodiment is provided at the support 1400 provided on the support member 1500.

In the first modification of the second embodiment, the passage 1300 is provided at the support 1400 configured to protrude upward from the support member 1500 supporting the first substrate 101. The passage 1300 is configured to penetrate the support 1400 horizontally to introduce the outside air into the transfer space 1600.

After the micro LEDs 100 are transferred to the micro LED transfer head 1000, the outside air is introduced into the transfer space 1600 through the passage 1300 opened by the opening means to lower the vacuum pressure in the transfer space 1600. Accordingly, it is possible to detach the micro LED transfer head 1000 from the upper surface of the support 1400 and raise up the micro LED transfer head 1000 with the micro LEDs 100.

Figure 10:
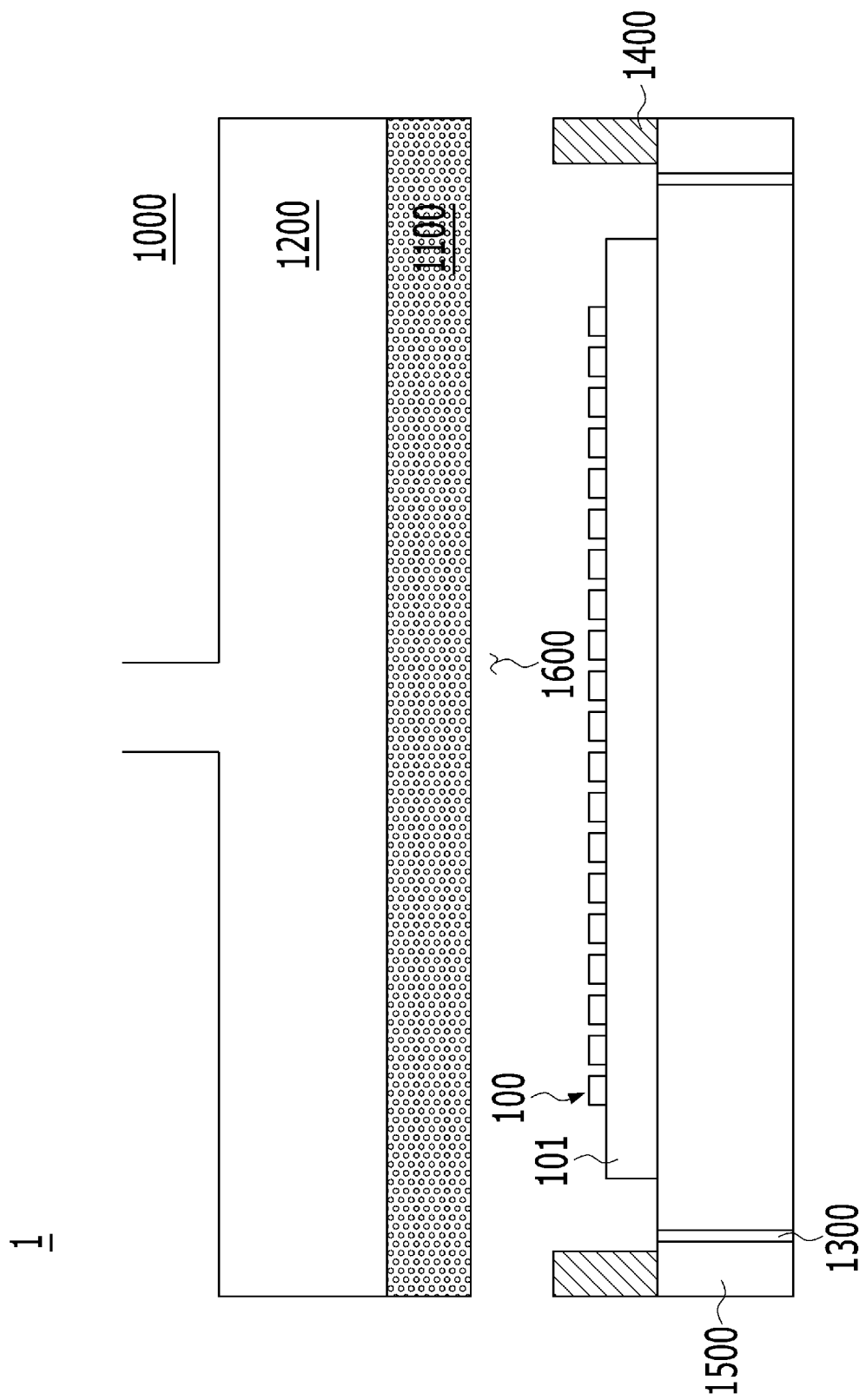
FIG. 10 is a view illustrating a second modification of the system for transferring a micro LED according to the second embodiment of the present invention.

FIG. 10 is a view illustrating a second modification of the system 1 for transferring a micro LED according to the second embodiment of the present invention. The second modification of the second embodiment differs from the second embodiment in that the passage 1300 through which the outside air is introduced into the transfer space 1600 according to the second modification of the second embodiment is provided at the support member 1500 supporting the first substrate 101.

In the second modification of the second embodiment, the passage 1300 is configured to extend from top to bottom of the support member 1500 vertically on the edge side of the support member 1500 supporting the first substrate 101. The passage 1300 of the second modification of the second embodiment may be provided at the edge side of the support member 1500 and provided at an inner side of the support 1400 configured on the periphery of the support member 1500 in a manner protruding upward. The passage 1300 is opened by the opening means after the transfer of the micro LEDs 100 to introduce the outside air into the transfer space 1600 sealed by the support 1400, thereby lowering the vacuum pressure in the transfer space 1600.

As described above, the embodiments and the modifications of the present invention is provided with the support 1400 to seal the transfer space 1600, whereby it is possible to prevent the inflow of outside air during the transfer of the micro LEDs 100, leading to improvement in the transfer efficiency. In addition, after the micro LEDs 100 are transferred onto the grip surface of the micro LED transfer head 1000, the outside air is introduced into the transfer space 1600 through the passage 1300 to lower the vacuum pressure and facilitate the raising of micro LED transfer head 1000 for transferring the micro LEDs 100 to the second substrate.

Third Embodiment

FIG. 11A is a view illustrating a state before a micro LED transfer head 1000 of a system 1 for transferring a micro LED descends according to a third embodiment of the present invention; and FIG. 11B is a view illustrating a state after the micro LED transfer head 1000 of the system 1 for transferring a micro LED descends according to the third embodiment of the present invention.

The system 1 for transferring a micro LED according to the third embodiment of the present invention includes: a micro LED transfer head 1000 having a grip surface where micro LEDs 100 are gripped; a first substrate 101 on which the micro LEDs 100 are formed; and a support member 1500 provided underneath the first substrate 101 to support the first substrate 101, wherein the micro LED transfer head 1000 includes a shielding portion 1400 configured on a periphery of the micro LED transfer head 1000 in a manner protruding downward beyond the grip surface. The first substrate 101 of the third embodiment may be the same substrate as the growth substrate 101 of FIG. 1, which is a substrate on which the micro LEDs 100 are fabricated. Therefore, the same reference numerals are used in the drawings referred to in the following description.

The micro LED transfer head 1000 constituting the system 1 for transferring a micro LED according to the third embodiment of the present invention will be described with reference to FIGS. 11A and 11B.

The micro LEDs 100 are gripped on the grip surface by the micro LED transfer head 1000. The micro LED transfer head 1000 includes the shielding portion configured on the periphery of the micro LED transfer head 1000 in a manner protruding downward beyond the grip surface, so that the micro LEDs 100 can be gripped to or removed from the grip surface.

As illustrated in FIGS. 11A and 11B, the shielding portion 1400 is configured on the periphery of the micro LED transfer head 1000 in a manner protruding downward beyond the grip surface. Here, the periphery of the micro LED transfer head 1000 may indicate an outer portion on the micro LED transfer head 1000, which corresponds to a micro LED present area where the micro LEDs 100 are formed on the upper surface of the first substrate 101.

The shielding portion 1400 configured on the periphery of the micro LED transfer head 1000 prevents an external factor that interferes with the grip force when the micro LED transfer head 1000 grips the micro LEDs 100 from entering into a transfer space 1300 defined while the lower end of the micro LED transfer head 1000 is spaced apart from the upper surfaces of the micro LEDs 100 of the first substrate 101. In this case, the shielding portion 1400 may be made of an elastic material to seal the transfer space 1300 so that an external factor that interferes with the grip force is prevented from entering into the transfer space 1300. In addition, the shielding portion 1400 made of an elastic material accommodates a transfer error caused by a mechanical tolerance of the micro LED transfer head 1000. Therefore, the shielding portion 1400 may serve as a buffer that prevents collision between the upper surface of the micro LED transfer head 1000 and upper surfaces of the micro LEDs 100 so as not to damage the micro LEDs 100.

The micro LED transfer head 1000 may use an electrostatic force, a suction force, a magnetic force, a van der Waals force, or the like to have the grip force gripping the micro LEDs 100. In this case, when foreign substances are adhered to the grip surface due to the electrostatic force, the suction force, the magnetic force, the van der Waals force, or the like, which is the grip force of the micro LED transfer head 1000, the grip force may be interfered with gripping of the micro LEDs 100.

Since the micro LED transfer head 1000 according to the present invention is provided with the shielding portion 1400 configured on the periphery of the micro LED transfer head 1000, the shielding portion 1400 is brought into contact with the upper surface of the support member 1500 when the micro LEDs 100 are transferred onto the grip surface of the micro LED transfer head 1000, so that the transfer space 1300 is sealed. This prevents foreign substances adhered to the grip surface due to the electrostatic force, the suction force, the magnetic force, the van der Waals force, or the like, which is the grip force of the micro LED transfer head 1000, from entering into the transfer space 1300, thereby improving the transfer efficiency.

When the micro LED transfer head 1000 electrostatically grips the micro LEDs 100 by using the electrostatic force, the shielding portion 1400 prevents an external factor that interferes with the electrostatic force of the micro LED transfer head 1000 from entering into the transfer space 1300. The external factor that interferes with the electrostatic force of the micro LED transfer head 1000 may be a charged foreign substance or the like.

In the case the external factor that interferes with the grip force when the micro LED transfer head 1000 grips the micro LEDs 100 is a charged foreign substance, the charged foreign substance is adhered to the grip surface to which the micro LEDs 100 are to be gripped, and the micro LEDs 100 may not be gripped. Accordingly, the micro LED transfer head 1000 according to the present invention has the shielding portion 1400 configured on the periphery of the micro LED transfer head 1000 in a manner that protrudes downward beyond the grip surface. Thus, when the micro LED transfer head 1000 descends to transfer the micro LEDs 100 as illustrated in FIG. 11B, the shielding portion 1400 is brought into contact with the upper surface of the support member 1500. Therefore, the transfer space 1300 is sealed, and an external factor such as a charged foreign substance is prevented from entering into the transfer space 1300, thereby blocking a factor that interferes with the electrostatic force and improving the transfer efficiency.

The micro LED transfer head 1000 may use a suction force. When the micro LED transfer head 1000 grips the micro LEDs 100 by using the suction force, the shielding portion 1400 prevents an external factor such as outside air and foreign substances which interfere with the suction force of the micro LED transfer head 1000 from entering into the transfer space 1300.

For example, the micro LED transfer head 1000 may have a porous member having pores and serving as a grip surface to apply the vacuum pressure to the pores of the porous member and grip the micro LEDs 100 by the vacuum suction force. In this case, a vacuum chamber may be provided on the porous member, wherein the vacuum chamber is connected to a vacuum port providing a vacuum pressure to the multiple pores of the porous member or releasing the vacuum pressure applied to the pores according to the operation of the vacuum port. A structure of engaging the vacuum chamber with the porous member is not limited as long as the structure is suitable for preventing gas or air from leaking to other parts when applying the vacuum pressure to the porous member or releasing the applied vacuum pressure.

When the micro LED transfer head 1000 having the porous member serving as the grip surface grips the micro LEDs 100 by using the suction force, an external factor such as outside air and foreign substances which interfere with the suction force may enter into the transfer space and lower the suction force gripping the micro LEDs.

In the case the external factor that interferes the suction force is the outside air when the micro LED transfer head 1000 grips the micro LEDs 100, the outside air may enter into the transfer space 1300 and a vortex may be generated thereby. As a result, the micro LEDs 100 may be shaken and may not be gripped onto the grip surface thereby.

In addition, the external factor that interferes with the suction force is foreign substances adhered when the micro LED transfer head 1000 grips the micro LEDs 100. In the process of transferring micro LEDs 100 onto the grip surface of the porous member having a large number of fine pores, the foreign substances may be adhered to the grip surface and block the pores. The foreign substances block the pores of the porous member and interfere with the suction force gripping the micro LEDs. In addition, when the foreign substances block the pores of apart of the porous member, the grip force gripping the micro LEDs 100 on the corresponding part of the porous member becomes uneven. Therefore, the micro LED transfer head 1000 of the present invention descends toward the upper surfaces of the micro LEDs 100 and transfers the micro LEDs 100 onto the grip surface, the shielding portion 1400 configured on the periphery of the micro LED transfer head 1000 in a manner protruding downward beyond the grip surface is brought into contact with the upper surface of the support member 1500, thereby sealing the transfer space 1300. Thus, it is possible to block an external factor such as outside air and foreign substances which interfere with the suction force from entering into the transfer space 1300. Therefore, the outside air is blocked and the micro LEDs 100 can be effectively transferred onto the grip surface without shaking of the micro LEDs 100 which may be caused by a vortex, and the inflow of the foreign substance blocking the pores can be prevented, thereby performing the transfer of the micro LEDs 100 with a uniform grip force.

In addition, the micro LED transfer head 1000 may use a magnetic force. When the micro LED transfer head 1000 magnetically grips the micro LEDs 100 by using the magnetic force, the shielding portion 1400 prevents an external factor such as a magnetic foreign substance which interferes with the magnetic force of the micro LED transfer head 1000 from entering into the transfer space 1300. When the micro LED transfer head 1000 magnetically grips the micro LEDs 100 by using the magnetic force, the magnetic substance may be coated on the upper surfaces of the micro LEDs 100.

In the case the external factor that interferes with the magnetic force of the micro LED transfer head 1000 is a magnetic foreign substance, the magnetic foreign substance entering from the outside is adhered to the grip surface to which the micro LEDs 100 are gripped, thereby interfering with the magnetic force of the micro LED transfer head 1000. Thus, the micro LEDs 100 may not be gripped. Accordingly, the micro LED transfer head 1000 according to the present invention has the shielding portion 1400 configured on the periphery of the micro LED transfer head 1000 in a manner that protrudes downward beyond the grip surface. Thus, when the micro LED transfer head 1000 descends to transfer the micro LEDs 100 as illustrated in FIG. 11B, the shielding portion 1400 is brought into contact with the upper surface of the support member 1500 to seal the transfer space 1300. Therefore, an external factor such as a magnetic foreign substance which interferes with the magnetic force is prevented from entering into the transfer space 1300, thereby blocking the magnetic interference.

The micro LED transfer head 1000 may use a van der Waals force. When the micro LED transfer head 1000 grips the micro LEDs 100 by using the van der Waals force, an external factor that interferes with the van der Waals force of the micro LED transfer head 1000, such as foreign substance, is prevented from entering into the transfer space 1300.

In the case the external factor that interferes with the van der Waals force is when the micro LED transfer head 1000 grips the micro LEDs 100 by using the van der Waals force is foreign substances, the foreign substances may enter into the transfer space 1300 and may be adhered to the grip surface such that the grip force gripping the LEDs 100 is interfered. Accordingly, the micro LED transfer head 1000 according to the present invention has the shielding portion 1400 configured on the periphery of the micro LED transfer head 1000 in a manner that protrudes downward beyond the grip surface. Thus, when the micro LED transfer head 1000 descends to transfer the micro LEDs 100, the shielding portion 1400 is brought into contact with the upper surface of the support member 1500. Therefore, the transfer space 1300 is sealed, and the external factor such as a foreign substance which interferes with the van der Waals force is prevented from entering into the transfer space 1300, thereby improving the transfer efficiency.

As illustrated in FIGS. 11A and 11B, in the system 1 for transferring a micro LED according to the third embodiment of the present invention, the micro LED transfer head 1000 grips the micro LEDs 100 onto the grip surface and has the shielding portion 1400 configured on the periphery of the micro LED transfer head 1000 in a manner protruding downward beyond the grip surface, and when the micro LED transfer head 1000 descends toward the first substrate 101 on which the micro LEDs 100 are formed and toward the support member 1500 provided below the first substrate 101 to support the first substrate 101 and transfers the micro LEDs 100 onto the grip surface, the shielding portion 1400 is brought into contact with the upper surface of the support member 1500. Thus, it is possible to seal the transfer space 1300 defined while the lower end of the micro LED transfer head 1000 is spaced apart from the upper surfaces of the micro LEDs 100 of the first substrate 101. Thus, an external factor that interferes with the grip force when the micro LED transfer head 1000 grips the micro LEDs 100 is prevented from entering into the transfer space 1300, thereby improving the transfer efficiency.

Although the horizontal area of the first substrate 101 of the system 1 for transferring a micro LED according to the third embodiment is illustrated in FIGS. 11A and 11B as being smaller than the horizontal area of the upper surface of the support member 1500, the horizontal area of the first substrate 101 may be equal to the horizontal area of the upper surface of the support member 1500, so that when the micro LED transfer head 1000 descends toward the upper surfaces of the micro LEDs 100, the shielding portion 1400 is brought into contact with the upper surface of the first substrate 101. In other words, the shielding portion 1400 may be in contact with the upper surface of the support member 1500 or the upper surfaces of the first substrate 101 when the micro LEDs 100 of the first substrate 101 are transferred to the grip surface. In addition, since the shielding portion 1400 is configured on the periphery of the micro LED transfer head 1000 in a manner protruding downward beyond the grip surface, the lower surface of the shielding portion 1400 may be brought into contact with the upper surface of the support member 1500 or the upper surfaces of the first substrate 101.

A system 1 for transferring a micro LED according to the fourth embodiment below differs from the system 1 of the third embodiment with respect to a position of the shielding portion 1400. The shielding portion 1400 of the third embodiment is configured on the periphery of the micro LED transfer head 1000 in the system 1, whereas a shielding portion 1400 of the fourth embodiment is configured on the support member 1500 supporting the first substrate 101 in the system 1. The configuration of the micro LED transfer head 1000 using the electrostatic force, the suction force, the magnetic force, and the van der Waals force is the same. Therefore, in the following description, only the features of the shape of the shielding portion 1400 configured on the support member 1500 will be described, the shielding portion 1400 blocking an external factor that interferes with the grip force such as the electrostatic force, the suction force, the magnetic force, and the van der Waals force from entering into the transfer space 1300.

Fourth Embodiment

Hereinafter, the fourth embodiment of the present invention will be described. It should be noted that the embodiment described below will be described with particular emphasis on characteristic components as compared with the third embodiment, and descriptions of the same or similar components as those of the third embodiment will be omitted.

In the system 1 for transferring a micro LED according to the fourth embodiment, a shielding portion 1400 is configured on a support member 1500, whereas the shielding member 1400 of the third embodiment is configured on the periphery of the micro LED transfer head 1000.

Figure 12:
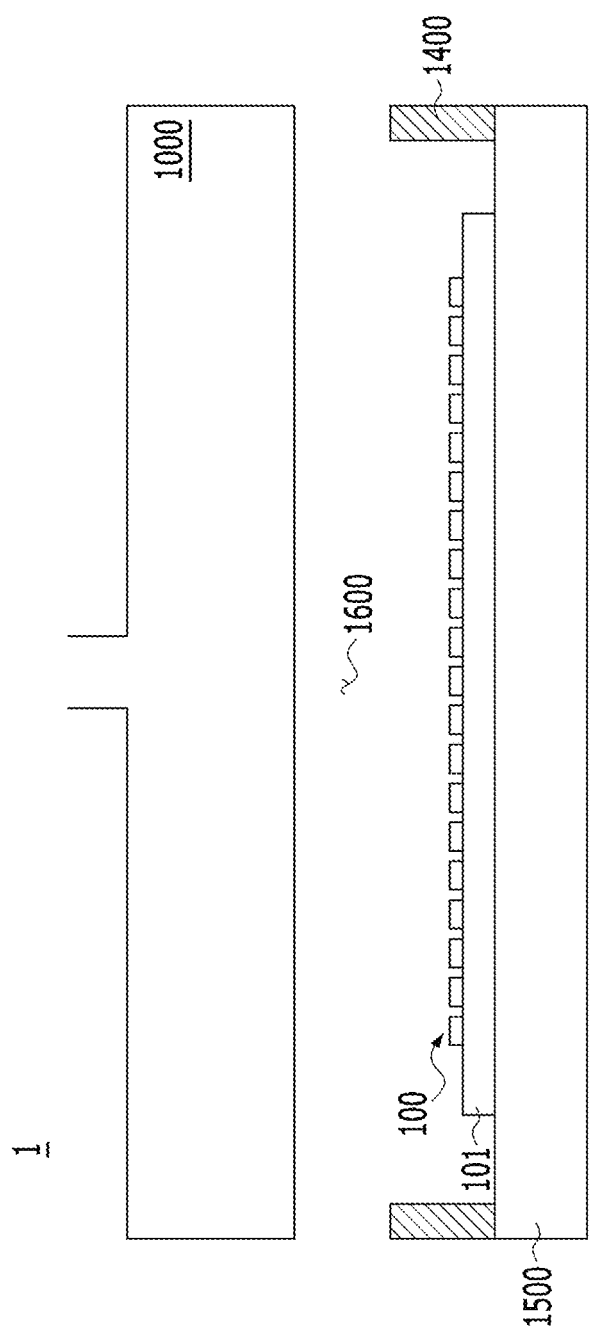
FIG. 12 is a view illustrating a system for transferring a micro LED according to a fourth embodiment of the present invention.

FIG. 12 is a view illustrating the system 1 for transferring a micro LED according to the fourth embodiment of the present invention. As illustrated in FIG. 12, a micro LED transfer head 1000 constituting the system 1 for transferring a micro LED of the fourth embodiment is in a state before descending.

The system 1 for transferring a micro LED according to the fourth embodiment includes: the micro LED transfer head 1000 gripping micro LEDs 100 onto a grip surface; a first substrate 101 on which the micro LEDs 100 are formed; and a support member 1500 supporting the first substrate 101.

As illustrated in FIG. 12, the support member 1500 is configured on a periphery of the support member 1500 in a manner that protrudes upward from the support member 1500 or configured on a periphery of the first substrate 101 in a manner that protrudes upward from the first substrate 101. Here, the periphery of the support member 1500 may indicate the outside of the first substrate 101 provided on the upper surface of the support member 1500. Although the horizontal area of the first substrate 101 of the fourth embodiment is illustrated in FIG. 12 as being smaller than the horizontal area of an upper surface of the support member 1500, the horizontal area of the first substrate 101 may be equal to the horizontal area of the upper surface of the support member 1500, so that the shielding portion 1400 is configured on the periphery of the first substrate 101 in a manner that protrudes upward from the first substrate 101. In the case the shielding portion 1400 is configured on the periphery of the first substrate 101 in a manner that protrudes upward from the first substrate 101, the periphery of the first substrate 101 may indicate an outer portion of the micro LED present area where the micro LEDs 100 are present.

When the micro LED transfer head 1000 descends toward upper surfaces of the micro LEDs 100 of the first substrate 101 to transfer the micro LEDs 100 onto the grip surface, the shielding portion 1400 configured on the periphery of the support member 1500 in a manner protruding upward is brought into contact with a periphery of the lower surface of the micro LED transfer head 1000. Since the shielding portion 1400 is configured on the periphery of the support member 1500 in a manner protruding upward, the upper surface of the shielding portion 1400 is brought into contact with the lower surface of the periphery of the micro LED transfer head 1000. Thus, the transfer space 1600 is sealed, which is defined while the lower end of the micro LED transfer head 1000 is spaced apart from the upper surfaces of the micro LEDs 100 of the first substrate 101.

The shielding portion 1400, which is configured on the periphery of the support member 1500 or configured on the first substrate 101 in a manner that protrudes upward, prevents an external factor that interferes with the grip force when the micro LED transfer head 1000 grips the micro LEDs 100 from entering into a transfer space 1600. In this case, the shielding portion 1400 may be made of an elastic material to seal the transfer space 1600 so that an external factor that interferes with the grip force is prevented from entering into the transfer space 1600. In addition, the shielding portion 1400 accommodates a transfer error caused by a mechanical tolerance of the micro LED transfer head 1000. Therefore, the shielding portion 1400 may serve as a buffer that prevents collision between the upper surface of the micro LED transfer head 1000 and upper surfaces of the micro LEDs 100 so as not to damage the micro LEDs 100.

As described above, the embodiments of the present invention include the shielding portion 1400, so that it is possible to prevent an external factor that interferes with the grip force of the micro LED transfer head 1000 from entering into the transfer space 1600 where the micro LEDs 100 are transferred. Thus, it is possible to prevent the grip force from being lowered by an external factor that may be adhered to the grip surface of the micro LED transfer head 1000 and interferes with the grip force, and it is possible to improve the transfer efficiency.

Fifth Embodiment

FIG. 13A is a view illustrating a state before a micro LED transfer head 1000 constituting a system 1 for transferring a micro LED descends toward a cleaning device according to a fifth embodiment of the present invention; and FIG. 13B is a view illustrating a state where the micro LED transfer head 1000 constituting the system 1 for transferring a micro LED descends toward the cleaning device and a cleaning space 1320 is sealed according to the fifth embodiment of the present invention.

The system 1 for transferring a micro LED according to the fifth embodiment of the present invention includes: the micro LED transfer head 1000 having a grip surface where micro LEDs 100 are gripped and having a sealing portion 1400 configured on the periphery of the micro LED transfer head 1000 in a manner protruding downward beyond the grip surface; and a cleaning device 1220 cleaning the grip surface.

The micro LED transfer head 1000 uses the suction force to grip or detach the micro LEDs 100. In this case, a porous member having pores may serve as a grip surface to apply the vacuum pressure to the pores of the porous member and grip the micro LEDs 100 by the vacuum suction force. A vacuum chamber may be provided on the porous member, wherein the vacuum chamber is connected to a vacuum port providing a vacuum pressure to the multiple pores of the porous member or releasing the vacuum pressure applied to the pores according to the operation of the vacuum port. A structure of engaging the vacuum chamber with the porous member is not limited as long as the structure is suitable for preventing gas or air from leaking to other parts when applying the vacuum pressure to the porous member or releasing the applied vacuum pressure.

In addition to the suction force, the micro LED transfer head 1000 uses the electrostatic force, the magnetic force, the van der Waals force, or the like to grip or detach the micro LEDs 100.

The micro LED transfer head 1000 includes the sealing portion 1400 configured on the periphery of the micro LED transfer head 1000 in a manner protruding downward beyond the grip surface. As illustrated in FIGS. 13A and 13B, the shielding portion 1400 of the fifth embodiment is configured on the periphery of the micro LED transfer head 1000 in a manner protruding downward beyond the grip surface. Here, the periphery of the micro LED transfer head 1000 may indicate an outer portion on the micro LED transfer head 1000, which corresponds to a micro LED present area where the micro LEDs 100 are formed on the upper surface of the growth substrate 101.

As illustrated in FIG. 13B, when the micro LED transfer head 1000 descends toward the upper surface of the cleaning device 1220 to clean the grip surface, the sealing portion 1400 is brought into contact with an upper surface of the cleaning device 1220. Since the sealing portion 1400 is configured on the periphery of the micro LED transfer head 1000 in a manner protruding downward beyond the grip surface, the lower surface of the sealing portion 1400 may be brought into contact with the upper surface of the cleaning device 1220. Thus, the cleaning space 1320 is sealed, which is defined while a lower end of the micro LED transfer head 1000 is spaced apart from the upper surface of the cleaning device 1220. The sealing portion 1400 may block foreign substances from entering into the cleaning space 1320, thereby improving the efficiency of cleaning the grip surface of the micro LED transfer head 1000. The shielding portion 1400 is made of an elastic material, thereby blocking the foreign substances from entering into the cleaning space 1320. In addition, when the micro LED transfer head 1000 descends to grip the micro LEDs 100 onto the grip surface, the sealing portion 1400 accommodates a transfer error caused by a mechanical tolerance of the micro LED transfer head 1000 and serves as a buffer that prevents collision between the upper surface of the micro LED transfer head 1000 and upper surfaces of the micro LEDs 100 so as not to damage the micro LEDs 100.

In the system 1 for transferring a micro LED of the present invention, the cleaning space 1320 is sealed by the sealing portion 1400, thereby blocking foreign substances from entering into the cleaning space 1320. In addition, the foreign substances in the closed cleaning space 1320 and the foreign substances on the grip surface are removed by the cleaning device 1220.

The cleaning device 1220 serves to clean the grip surface of the micro LED transfer head 1000.

The cleaning device may be a device for generating a plasma. In the case the cleaning device 1220 is a device generating a plasma, a plasma may be generated on the grip surface of the micro LED transfer head 1000 to clean the foreign substances adhered to the grip surface. The grip surface of the micro LED transfer head 1000 is a surface to which the micro LEDs 100 are gripped. Therefore, when foreign substances generated by repeated gripping are not removed, the grip force may be reduced. For example, in the case the micro LED transfer head 1000 has a porous member serving as the grip surface, foreign substances may block the pores and reduce the grip force. The cleaning device 1220 generates a plasma to remove foreign substances adhered to the grip surface and interfering with the grip force. The plasma generated by the cleaning device 1220 burns and removes the foreign substances. Here, the foreign substances may be foreign substances formed on the grip surface of the micro LED transfer head 1000 or may be foreign substances present in the cleaning space 1320. In the case the cleaning device 1220 is a device for generating a plasma, the plasma generated by the cleaning device 1220 removes the foreign substances, so that the micro LED transfer head 1000 can transfer the micro LEDs 100 effectively.

The cleaning device 1220 may be a device for spraying purge gas. The cleaning device 1220 removes a factor interfering with the grip force, such as foreign substances, from the grip surface of the micro LED transfer head 1000 by spraying the purge gas. In the case the cleaning device 1220 is a device for spraying purge gas, the cleaning device 1220 may have a structure in which multiple spray nozzles are provided so as to spray gas from the respective spray nozzles or may be configured in a surface jet form to uniformize the pressure and the amount of gas to be sprayed. The surface jet form may be provided with an upper plate having multiple pores or holes or may be provided using a porous member serving as an upper plate.

The purge gas sprayed by the cleaning device 1220 removes a factor, such as static electricity, interfering with the micro LED transfer head 1000 to grip the micro LEDs 100. Static electricity may be generated due to contact, friction, peeling, or the like between two members of the transfer head 1000, the micro LEDs 100, and the display substrate 301 in the process of transferring the micro LEDs 100 by the micro LED transfer head 1000 having the porous member serving as the grip surface. In addition, static electricity may be generated due to air flow generated in the pores in the process of gripping the micro LEDs 100 by the micro LED transfer head 1000 using the vacuum suction force. In the case the micro LEDs 100 are gripped by an electrostatic force, actively inducing static electricity is required. However, in the case the electrostatic force is not used for gripping the micro LEDs 100, the electrostatic force affects gripping of the micro LEDs 100 in a negative way and is thus required to be removed. The cleaning device 1220 removes the preformed static electricity on the grip surface of the micro LED transfer head 1000 by spraying the purge gas. Here, a type of the purge gas is not limited as long as gas is capable of removing static electricity. For example, the purge gas may be ionized gas. As the ionized gas is sprayed onto the grip surface of the micro LED transfer head having the porous member serving as the grip surface, the static electricity generated on the grip surface of the micro LED transfer head is removed.

A factor interfering with the micro LED transfer head 1000 to grip the micro LEDs 100 may be foreign substances. For example, since the micro LED transfer head having the porous member serving as the grip surface includes a large number of fine pores, foreign substances may be adhered to the grip surface of the porous member, thereby blocking the pores. The foreign substances block the pores of the porous member and reduce the grip force of the micro LED transfer head. In addition, when the foreign substances block the pores of a part of the porous member, the grip force gripping the micro LEDs 100 on the corresponding part of the porous member becomes uneven. Therefore, the foreign substances interfere with the grip force and are required to be removed from the grip surface of the porous member through cleaning.

In order to remove such foreign substances by cleaning, the cleaning device 1220 sprays the purge gas onto the grip surface. Here, a type of the purge gas is not limited as long as gas is capable of removing the foreign substances. For example, the purge gas may be inert gas including nitrogen, argon, and the like.

The cleaning device 1220 may be a device for blowing an ion wind. When the micro LED transfer head performs the transfer, static electricity may be generated between the growth substrate 101 and the micro LED transfer head 1000 due to friction or the like or may be generated between the display substrate 301 and the micro LED transfer head 1000 due to electrification. Accordingly, in the unloading process in which the micro LEDs 100 are mounted on the display substrate 301 after the micro LED transfer head 1000 grips the micro LEDs 100 from the growth substrate 101, the micro LEDs 100 may stick to the micro LED transfer head 1000 and be unloaded to the display substrate 301 in a wrong position or unloading of the micro LEDs 100 may not be performed. The cleaning device 1220 removes the static electricity generated on the grip surface by blowing an ion wind.

The cleaning device 1220 may be a device for removing static electricity. For example, the cleaning device 1220 may be an electron capture detector (ECD) which is a device for removing static electricity. The cleaning device 1220 for removing static electricity contacts with the grip surface of the micro LED transfer head 1000 and removes static electricity generated by friction or the like in the transfer process of the micro LED transfer head 1000.

Alternatively, the cleaning device 1220 may be a device for wiping and removing foreign substances or a device for spraying a cleaning agent and removing foreign substances. There is no limitation to the cleaning device 1220 as long as the cleaning device 1220 is capable of removing a factor by cleaning, which interferes with the gripping of the grip surface of the micro LED transfer head 1000. Here, when the cleaning agent is sprayed, a drying device may be additionally provided inside or outside the cleaning device 1220 to dry the grip surface of the micro LED transfer head 1000.

Figure 14:
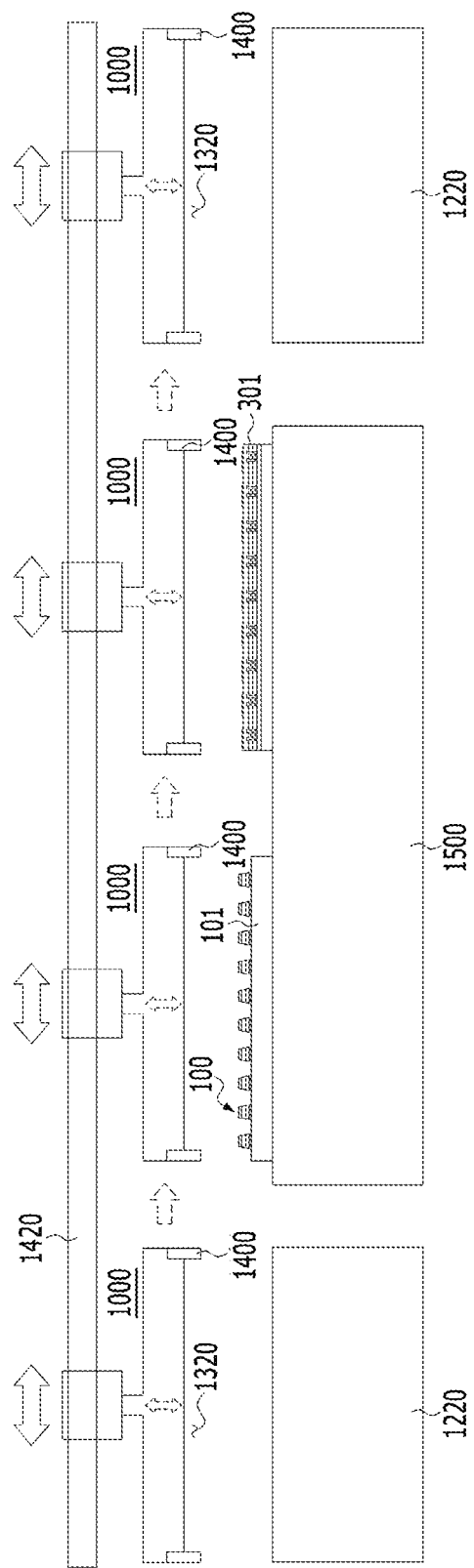
FIG. 14 is a view illustrating an arrangement of the system for transferring a micro LED according to the fifth embodiment of the present invention.

The system 1 for transferring a micro LED of the fifth embodiment including the cleaning device 1220 may be arranged as illustrated in the FIG. 14 to clean the grip surface of the micro LED transfer head 1000.

FIG. 14 is a view illustrating an arrangement of the system 1 for transferring a micro LED according to the fifth embodiment of the present invention. As illustrated in FIG. 14, the system 1 for transferring a micro LED according to the fifth embodiment of the present invention includes: the micro LED transfer head 1000 having the sealing portion 1400 configured on the periphery of the micro LED transfer head 1000 in a manner protruding downward beyond the grip surface; and a cleaning device 1220. The cleaning device 1220 cleans the grip surface of the micro LED transfer head 1000 before the micro LED transfer head 1000 grips the micro LEDs 100 or cleans the grip surface of the micro LED transfer head 1000 after the micro LED transfer head 1000 transfers and mounts the micro LEDs 100.

Referring to FIG. 14, in the system 1 for transferring a micro LED according to the fifth embodiment of the present invention, the cleaning device 1220, the growth substrate 101, and the display substrate 301 are sequentially disposed in accordance with a process sequence. In the present invention, the drawing illustrates that the cleaning apparatus 1220, the growth substrate 101, the display substrate 301, and the cleaning apparatus 1220 are arranged in the process sequence such that the cleaning device 1220 is provided before the growth substrate 101 and after the display substrate 301, with the cleaning device 1220, the growth substrate 101. In fact, the cleaning device 1220, the growth substrate 101, and the display substrate 301 are arranged in this order, or the growth substrate 101, the display substrate 301, and the cleaning device 1220 are arranged in this order to conform to the process sequence.

First, the cleaning device 1220 may clean the grip surface of the micro LED transfer head 1000 before the micro LED transfer head 1000 grips the micro LEDs 100.

Here, the micro LED transfer head 1000 is installed so as to be movable in the horizontal direction on a guide member 1420.

The micro LED transfer head 1000 moves above the cleaning device 1220. Thereafter, the micro LED transfer head 1000 descends toward the cleaning device 1220. Accordingly, the sealing portion 1400 is brought into contact with an upper surface of the cleaning device 1220, and the cleaning space 1320 is sealed. The cleaning device 1220 removes foreign substances in the closed cleaning space 1320 and foreign substances on the grip surface of the micro LED transfer head 1000. Here, the cleaning device 1220 is capable of removing a factor reducing the grip force such as foreign substances and may be one of a device for generating a plasma, a device for spraying purge gas, a device for blowing an ion wind, a device for removing static electricity, a device for wiping away foreign substances, or a device for spraying a cleaning agent, or the like. The micro LED transfer head 1000 is raised from the cleaning device 1220.

Next, the micro LED transfer head 1000 moves in the horizontal direction along the guide member 1420 and is positioned above the growth substrate 101. The growth substrate 101 is provided on a base member 1500. The micro LEDs 100 are manufactured and detachably provided on the growth substrate 101. The micro LED transfer head 1000 descends and grips the micro LEDs 100 provided on the growth substrate 101, and then the micro LED transfer head 1000 is raised again.

Thereafter, the micro LED transfer head 1000 moves in the horizontal direction along the guide member 1420 and is positioned above the display substrate 301. The display substrate 301 is provided on the base member 1500. The display substrate 301 may be a temporary support substrate or may be configured with a circuitry including a thin-film transistor (TFT). The micro LED transfer head 1000 descends and transfers the micro LEDs 100 to the display substrate 301, and then the micro LED transfer head 1000 is raised again.

The cleaning device 1220 may clean the grip surface of the micro LED transfer head 1000 after the micro LED transfer head 1000 transfers and mounts the micro LEDs 100.

First, the micro LED transfer head 1000 moves above the growth substrate 101. Thereafter, the micro LED transfer head 1000 descends toward the growth substrate 101. The micro LED transfer head 1000 grips the micro LEDs 100 provided on the growth substrate 101 and is raised.

Thereafter, the micro LED transfer head 1000 moves in the horizontal direction along the guide member 1420 and is positioned above the display substrate 301. The micro LED transfer head 1000 descends and transfers the micro LEDs 100 to the display substrate 301, and then the micro LED transfer head 1000 is raised again.

Thereafter, the micro LED transfer head 1000 moves in the horizontal direction along the guide member 1420 and is positioned above the cleaning device 1220. Thereafter, the micro LED transfer head 1000 descends toward the cleaning device 1220. Accordingly, the sealing portion 1400 is brought into contact with the upper surface of the cleaning device 1220, and the cleaning space 1320 is sealed. The cleaning device 1220 removes foreign substances in the closed cleaning space 1320 and foreign substances on the grip surface of the micro LED transfer head 1000.

The micro LED transfer head 1000 of the system 1 for transferring a micro LED of the fifth embodiment moves along the guide member 1420 in the horizontal direction and reaches the initial position in order to repeat the process. The initial position may differ depending on the process sequence. When the cleaning device 1220 cleans the grip surface of the micro LED transfer head 1000 before the micro LED transfer head 1000 grips the micro LEDs 100, the initial position is a position above the cleaning device 1220. On the other hand, when the cleaning device 1220 cleans the grip surface of the micro LED transfer head 1000 after the micro LED transfer head 1000 transports and mounts the micro LEDs 100, the initial position is a position above the growth substrate 101.

Although not described in the present invention, after the cleaning device 1220 cleans the grip surface, the system 1 for transferring a micro LED of the fifth embodiment may perform a process of inspecting the grip surface of the micro LED transfer head 1000 to determine whether the grip surface is cleaned well. The process of inspecting the grip surface of the micro LED transfer head 1000 may be suitably added in accordance with the process sequence of the system 1 for transferring a micro LED and performed.

As described above, in the system 1 for transferring a micro LED of the fifth embodiment, the cleaning space 1320 is sealed by the sealing portion 1400 provided in the micro LED transfer head 1000 such that foreign substances are blocked from entering into the cleaning space 1320. Thus, the efficiency of the cleaning device 1220 cleaning the grip surface of the micro LED transfer head 1000 can be increased.

A system 1 for transferring a micro LED according to a sixth embodiment below differs from the system 1 of the fifth embodiment with respect to a position of the shielding portion 1400. The shielding portion 1400 of the fifth embodiment is provided on the micro LED transfer head 1000 in the system 1, whereas a shielding portion 1400 of the sixth embodiment is provided on the cleaning device 1220. The configuration of the cleaning device 1220 of the sixth embodiment is the same as that of the cleaning device 1220 of the fifth embodiment described above, and thus the detailed description thereof will be omitted.

Sixth Embodiment

Hereinafter, the sixth embodiment of the present invention will be described. It should be noted that the embodiment described below will be described with particular emphasis on characteristic components as compared with the fifth embodiment, and descriptions of the same or similar components as those of the fifth embodiment will be omitted.

Figure 15:
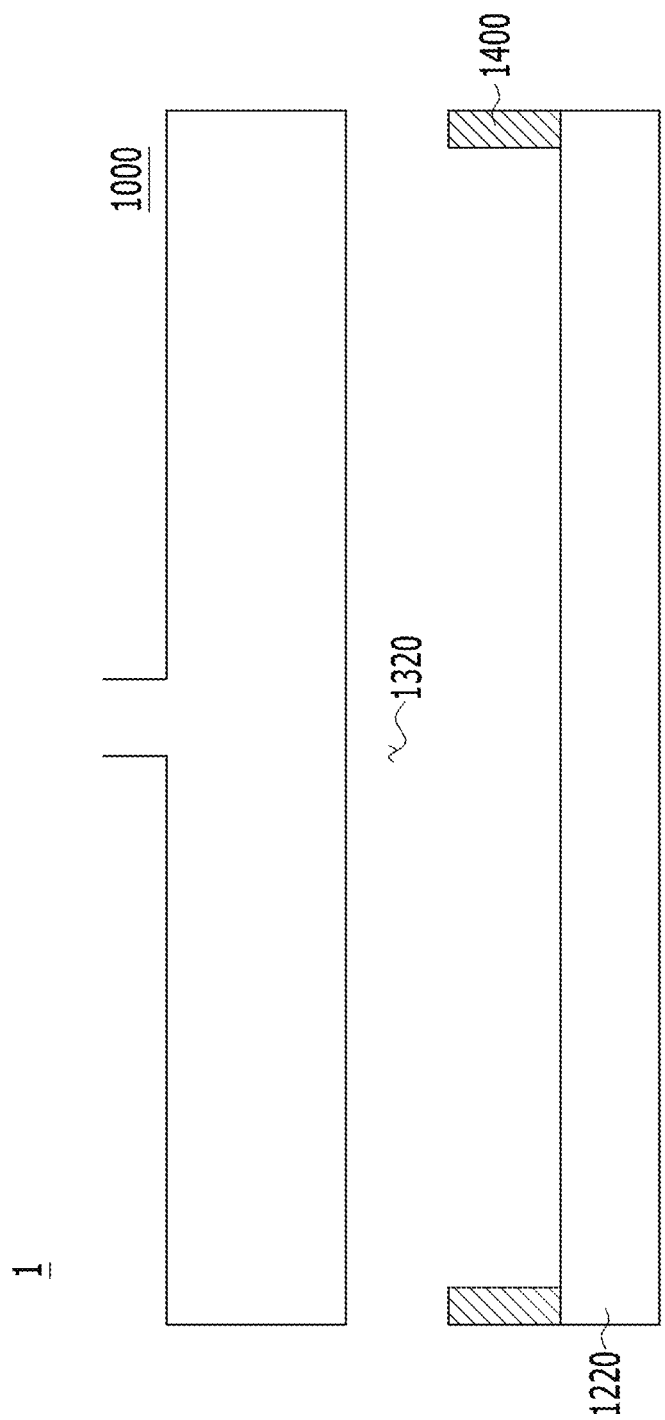
FIG. 15 is a view illustrating a system for transferring a micro LED according to a sixth embodiment of the present invention.

FIG. 15 is a view illustrating a system 1 for transferring a micro LED according to the sixth embodiment of the present invention.

The system 1 for transferring a micro LED according to the sixth embodiment includes: a micro LED transfer head 1000 gripping micro LEDs 100 onto a grip surface; and a cleaning device 1220 cleaning the grip surface.

The cleaning device 1220 for cleaning the grip surface is configured with a sealing portion 1400 on a periphery of the cleaning device 1220 in a manner that protrudes upward from the cleaning device 1220. Here, the periphery of the cleaning device 1220 may indicate an outer portion on the cleaning device 1220, which corresponds to a micro LED present area on the grip surface where the micro LEDs 100 of the growth substrate 101 are gripped and present.

As illustrated in FIG. 15, when the micro LED transfer head 1000 descends toward an upper surface of the cleaning device 1220 to clean the grip surface, the sealing portion 1400 is brought into contact with a periphery of a lower surface of the micro LED transfer head 1000. Thus, the cleaning space 1320 is sealed, which is defined while a lower end of the micro LED transfer head 1000 is spaced apart from the upper surface of the cleaning device 1220. The sealing portion 1400 prevents foreign substances from entering into the cleaning space 1320 while the cleaning device 1220 cleans the micro LED transfer head 1000. Thus, only foreign substances of the cleaning space 1320 and foreign substances on the grip surface of the micro LED transfer head 1000 are present in the cleaning space 1320. Accordingly, foreign substances are prevented from entering into the cleaning space 1320 and from interfering with the cleaning while the cleaning device 1220 is operated to clean the grip surface of the micro LED transfer head 1000, so that the cleaning device 1220 can perform removal of foreign substances well.

The sealing portion 1400 may be made of an elastic material. The shielding portion 1400 seals the cleaning space 1320 and blocks the foreign substances from entering into the cleaning space 1320. In addition, when the micro LED transfer head 1000 descends to grip the micro LEDs 100 onto the grip surface, the sealing portion 1400 accommodates a transfer error caused by a mechanical tolerance of the micro LED transfer head 1000 and serves as a buffer that prevents damage to the micro LEDs 100.

The cleaning device 1220 may be a device for generating a plasma, a device for spraying purge gas, a device for blowing an ion wind, a device for removing static electricity, a device for wiping away foreign substances, or a device for spraying a cleaning agent, or the like. However, a type of the cleaning device 1220 is not limited as long as the cleaning device 1220 is capable of removing a factor by cleaning, which reduces the grip force of the micro LED transfer head 1000.

As in the case the cleaning device 1220 of the fifth embodiment illustrated in FIG. 14, the cleaning device 1220 of the sixth embodiment may be disposed in accordance with the process sequence. Accordingly, the cleaning device 1220 cleans the grip surface of the micro LED transfer head 1000 before the micro LED transfer head 1000 grips the micro LEDs 100 or the cleaning device 1220 cleans the grip surface of the micro LED transfer head 1000 after the micro LED transfer head 1000 transfers and mounts the micro LEDs 100. In addition, according to the sixth embodiment, a process of inspecting the grip surface of the micro LED transfer head 1000 may be suitably added in accordance with the process sequence of the system 1 for transferring a micro LED and performed.

As described above, the embodiments of the present invention include the sealing portion 1400 to seal the cleaning space 1320 while removing a factor, such as foreign substances, reducing the grip force of the grip surface of the micro LED transfer head 1000, so that it is possible to prevent the foreign substances from entering the cleaning space 1320. Thus, only foreign substances of the cleaning space 1320 and foreign substances on the grip surface are present in the cleaning space 1320. The cleaning device 1220 can clean the grip surface of the micro LED transfer head 1000 without interference of foreign substances which may enter into the cleaning space 1320, thereby improving the cleaning efficiency in the system for transferring a micro LED.

As described above, the present invention has been described with reference to the embodiments. However, those skilled in the art will appreciate that various modifications, additions and substitutions are possible, without departing from the scope and spirit of the invention as disclosed in the accompanying claims.

What is claimed is:

1. A system for transferring a micro LED, the system comprising:
   a micro LED transfer head including a porous member having pores and serving as a grip surface, the micro LED transfer head including a support configured on a periphery of the micro LED transfer head in a manner protruding downward beyond the grip surface;
   a first substrate on which a micro LED is formed; and
   a support member provided underneath the first substrate to support the first substrate,
   wherein the support contacts with an upper surface of the support member or with an upper surface of the first substrate when transferring the micro LED of the first substrate to the grip surface.

2. The system of claim 1, wherein a passage is provided in the micro LED transfer head, the support, or the support member to introduce outside air into a transfer space.

3. A system for transferring a micro LED, the system comprising:
   a micro LED transfer head including a porous member serving as a grip surface having pores;
   a support member supporting a first substrate on which a micro LED is formed; and
   a support configured on a periphery of the support member in a manner that protrudes upward from the support member or configured on a periphery of the first substrate in a manner that protrudes upward from the first substrate.

* * * * *